(12) United States Patent
Chen et al.

(10) Patent No.: US 12,469,742 B2
(45) Date of Patent: Nov. 11, 2025

(54) SHALLOW TRENCH ISOLATION FORMING METHOD AND STRUCTURES RESULTING THEREFROM

(71) Applicant: Taiwan Semiconductor Manufacturing Co., Ltd., Hsinchu (TW)

(72) Inventors: Szu-Ying Chen, Hsinchu (TW); Sen-Hong Syue, Zhubei (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/401,955

(22) Filed: Jan. 2, 2024

(65) Prior Publication Data
US 2024/0136220 A1    Apr. 25, 2024

Related U.S. Application Data

(60) Division of application No. 17/715,261, filed on Apr. 7, 2022, now Pat. No. 11,901,218, which is a (Continued)

(51) Int. Cl.
*H01L 21/762*  (2006.01)
*H10D 62/10*  (2025.01)
(Continued)

(52) U.S. Cl.
CPC ..... *H01L 21/76229* (2013.01); *H10D 62/115* (2025.01); *H10D 84/0151* (2025.01); (Continued)

(58) Field of Classification Search
CPC ........ H10L 21/76229; H10L 21/76224; H10D 62/115; H10D 62/151; H10D 62/822; H10D 84/0151; H10D 84/0158; H10D 84/038; H10D 84/834; H10D 84/0193; H10D 84/0188; H10D 84/853; H10D 30/797; H10D 64/021; H10D 64/017
See application file for complete search history.

(56) References Cited

U.S. PATENT DOCUMENTS 9,520,392 B1 * 12/2016 Cheng ................ H10D 30/0217
10,217,741 B2 * 2/2019 Chang ............. H01L 21/823481
(Continued)

*Primary Examiner* — Dao H Nguyen
(74) *Attorney, Agent, or Firm* — Slater Matsil, LLP

(57) ABSTRACT

A method includes forming a first plurality of fins in a first region of a substrate, a first recess being interposed between adjacent fins in the first region of the substrate, the first recess having a first depth and a first width, forming a second plurality of fins in a second region of the substrate, a second recess being interposed between adjacent fins in the second region of the substrate, the second recess having a second depth and a second width, the second width of the second recess being less than the first width of the first recess, the second depth of the second recess being less than the first depth of the first recess, forming a first dielectric layer in the first recess and the second recess, and converting the first dielectric layer in the first recess and the second recess to a treated dielectric layer.

20 Claims, 25 Drawing Sheets

Related U.S. Application Data continuation of application No. 16/917,159, filed on Jun. 30, 2020, now Pat. No. 11,302,567.

(51) Int. Cl.
*H10D 84/01* (2025.01)
*H10D 84/03* (2025.01)
*H10D 84/83* (2025.01)

(52) U.S. Cl.
CPC ....... *H10D 84/0158* (2025.01); *H10D 84/038* (2025.01); *H10D 84/834* (2025.01)

(56) References Cited

U.S. PATENT DOCUMENTS

| | | | |
|---|---|---|---|
| 10,861,960 B1 | 12/2020 | Wu et al. | |
| 2014/0001562 A1* | 1/2014 | Liaw | H10B 10/12 |
| | | | 257/E21.616 |
| 2017/0005102 A1* | 1/2017 | Feng | H10D 84/0193 |
| 2017/0005181 A1* | 1/2017 | Liou | H01L 21/31 |
| 2018/0122903 A1* | 5/2018 | Cheng | H10D 84/038 |
| 2018/0151414 A1* | 5/2018 | Wu | H10D 84/038 |
| 2020/0144421 A1* | 5/2020 | Zhou | H10D 84/0158 |

\* cited by examiner

SHALLOW TRENCH ISOLATION FORMING METHOD AND STRUCTURES RESULTING THEREFROM

PRIORITY CLAIM AND CROSS-REFERENCE

This patent application is a divisional of U.S. application Ser. No. 17/715,261, filed on Apr. 7, 2022, which is a continuation of U.S. application Ser. No. 16/917,159, filed on Jun. 30, 2020, now U.S. Pat. No. 11,302,567, issued on Apr. 12, 2022, which applications are hereby incorporated by reference herein as if reproduced in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
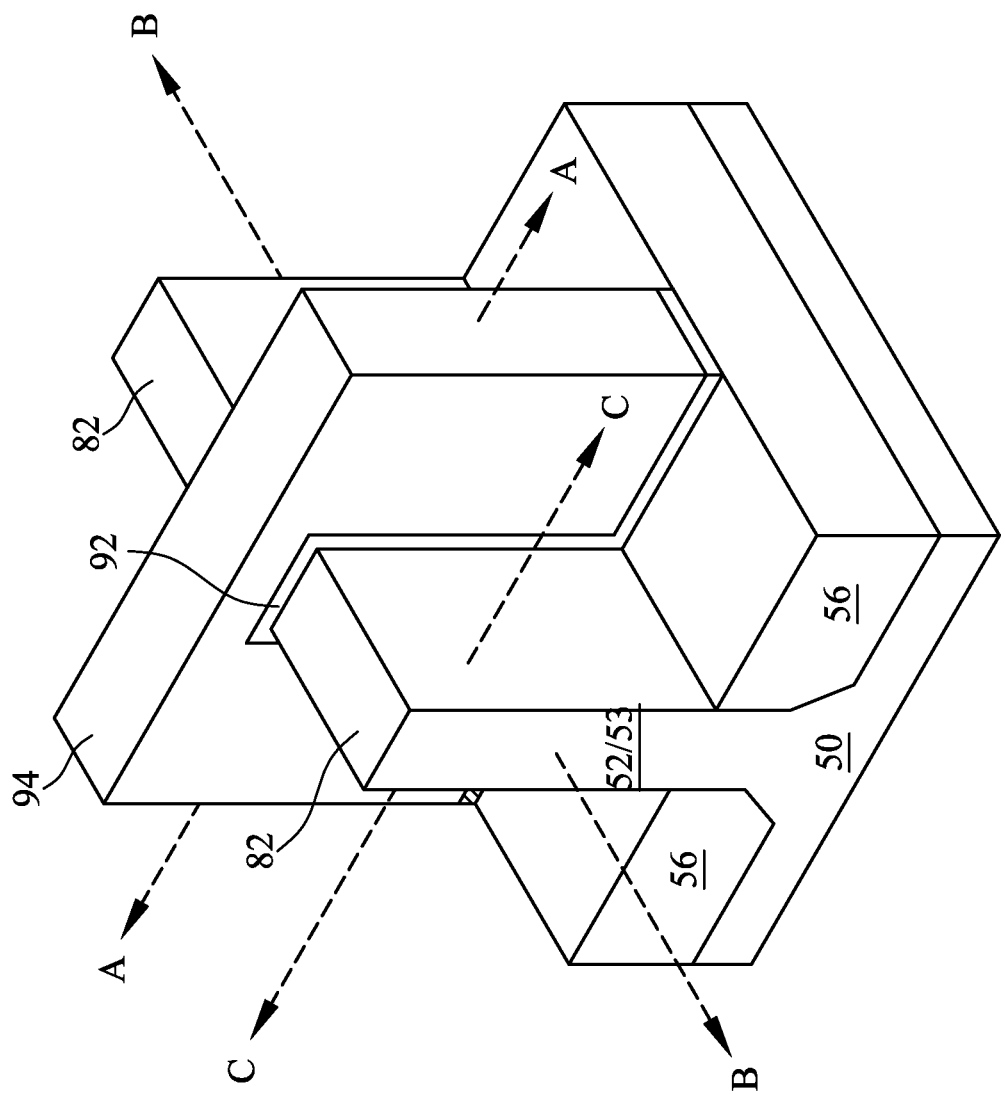
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to, but not limited to the formation of a Shallow Trench Isolation (STI) region. The embodiments of the present disclosure are discussed in the context of forming a Fin Field-Effect Transistor (FinFET) device. However, the methods of the present disclosure may be applicable to other types of devices (e.g., a nanostructure (including nanowire and gate all around) field effect transistor (NSFET), or the like). These embodiments include methods applied to, but not limited to the formation of a first dielectric layer in a first region of a die and in a second region of the die. A first pair of adjacent fins are separated by a first width in the first region and a second pair of adjacent fins are separated by a second width different than the first width in the second region. For example, a fin density in the first region may be less than a fin density in the second region. Subsequently, a conversion process is applied to convert the first dielectric material to a second dielectric material in the first region and the second region. When the first dielectric material is between two adjacent fins, an efficiency of conversion as well as a rate of conversion of the first dielectric material to the second dielectric material is dependent on a width between sidewalls of the two adjacent fins. This may have undesirable effects, such as a non-uniform depth of conversion between the first dielectric layer in the first region and the first dielectric layer in the second region. This may have a negative impact on the quality and the composition of the converted second dielectric layer and affect an etch rate of a subsequent etching process, which may result in uneven etching in the first region and the second region and also impact electrical performance. The embodiments of the present disclosure describe a process that results in the converted second dielectric layer in the first region and the converted second dielectric layer in the second region having a more uniform quality and composition. In addition, the embodiments of this disclosure allow for an ability to control the converted second dielectric layer thickness and depth uniformity in the first region and the second region and allows for a complete conversion of the first dielectric material to the second dielectric material in both the first region and the second region.

FIG. 1 illustrates an example of a FinFET in a three-dimensional view, in accordance with some embodiments. The FinFET comprises a fin 52 or a fin 53 on a substrate 50 (e.g., a semiconductor substrate). Isolation regions 56 are disposed in the substrate 50, and the fin 52 or the fin 53 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 or the fin 53 is illustrated as a single, continuous material as the substrate 50, the fin 52 or the fin 53 and/or the substrate 50 may comprise a single material or a plurality of materials. In this context, the fin 52 or the fin 53 refers to the portion extending between the neighboring isolation regions 56.

A gate dielectric layer 92 is along sidewalls and over a top surface of the fin 52 or the fin 53, and a gate electrode 94 is over the gate dielectric layer 92. Source/drain regions 82 are disposed in opposite sides of the fin 52 or the fin 53 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 or the fin 53 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in nanostructure (e.g., nanosheet, nanowire, gate-all-around, or the like) field effect transistors (NSFETs), or the like.

FIGS. 2 through 8A and FIGS. 9 through 22B are cross-sectional views of intermediate stages in the manufacturing of FinFETs, in accordance with some embodiments. FIGS. 2 through 8A and FIGS. 9 through 13 illustrate reference cross-section A-A illustrated in FIG. 1, except for multiple fins/FinFETs. FIGS. 14A, 15A, 16A, 17A, 18A, 19A, 20A, 21A, and 22A are illustrated along reference cross-section A-A illustrated in FIG. 1, and FIGS. 14B, 15B, 16B, 17B, 18B, 19B, 20B, 20C, 21B, and 22B are illustrated along a similar cross-section B-B illustrated in FIG. 1, except for multiple fins/FinFETs. FIGS. 16C and 16D are illustrated along reference cross-section C-C illustrated in FIG. 1, except for multiple fins/FinFETs.

Figure 2:
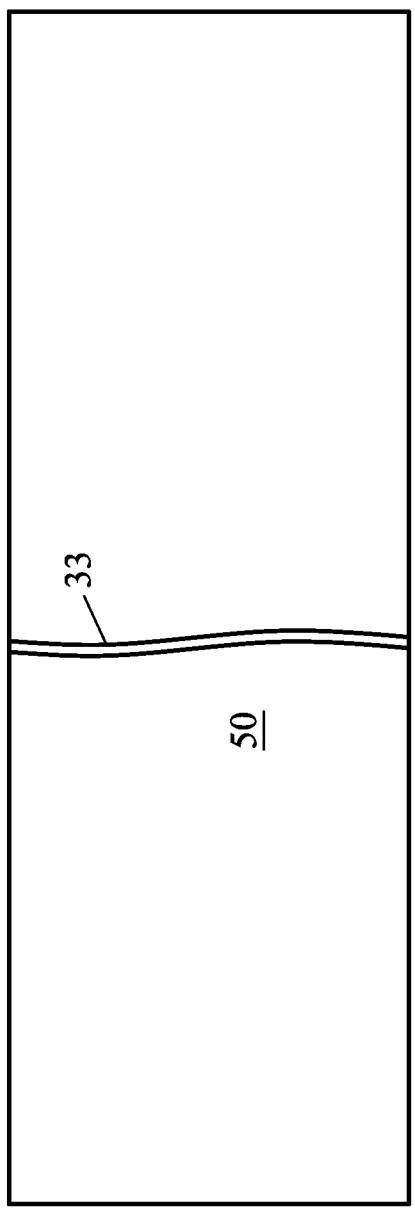
FIGS. 2, 3, 4, 5, 6, 7 and 8A are cross-sectional views of intermediate stages in the manufacturing of FinFETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

Figure 3:
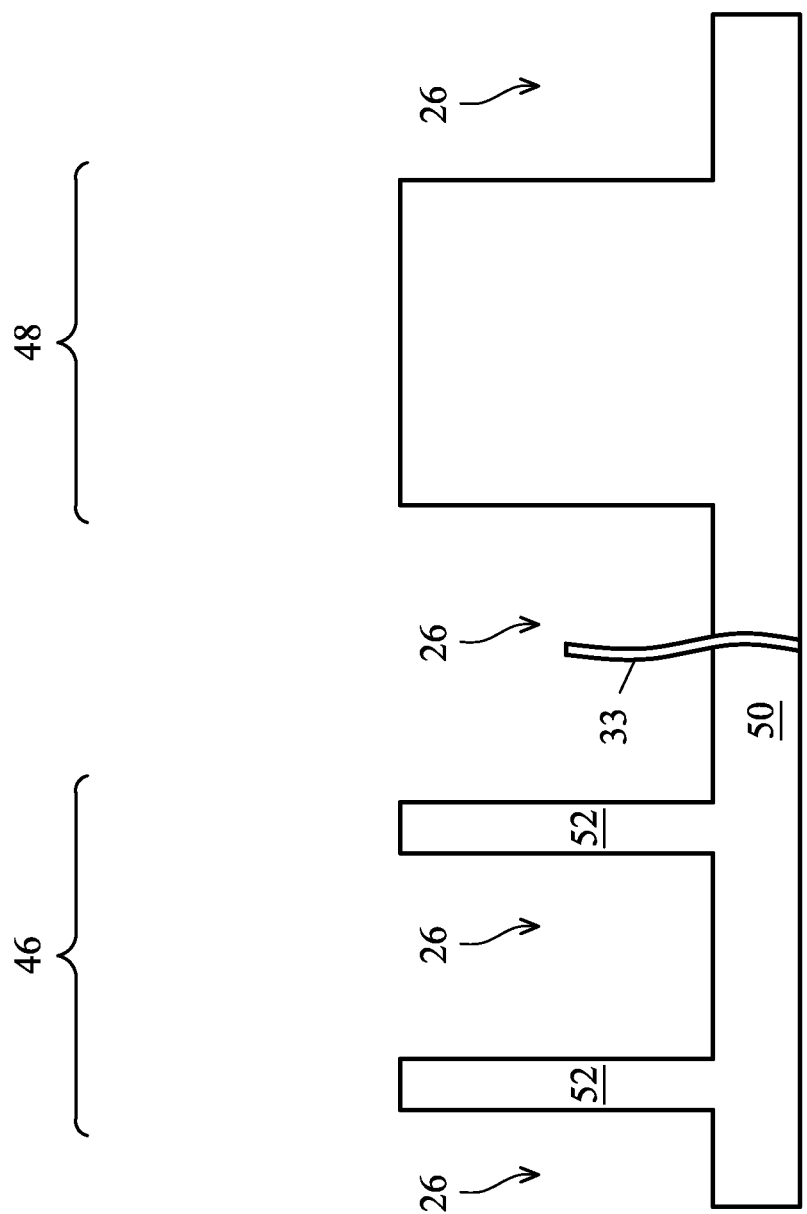

In FIG. 3, fins 52 are formed in a first region 46 of the substrate 50. The fins 52 are semiconductor strips. In some embodiments, the fins 52 may be formed in the substrate 50 by etching trenches 26 in the substrate 50. The etching may be one or more of any acceptable etch process, such as a reactive ion etch (RIE), neutral beam etch (NBE), the like, or a combination thereof. The etching may be anisotropic. Although the fins 52 are illustrated in FIG. 3 as having linear edges, the fins 52 may have rounded edges or any other suitable shape.

Figure 4:
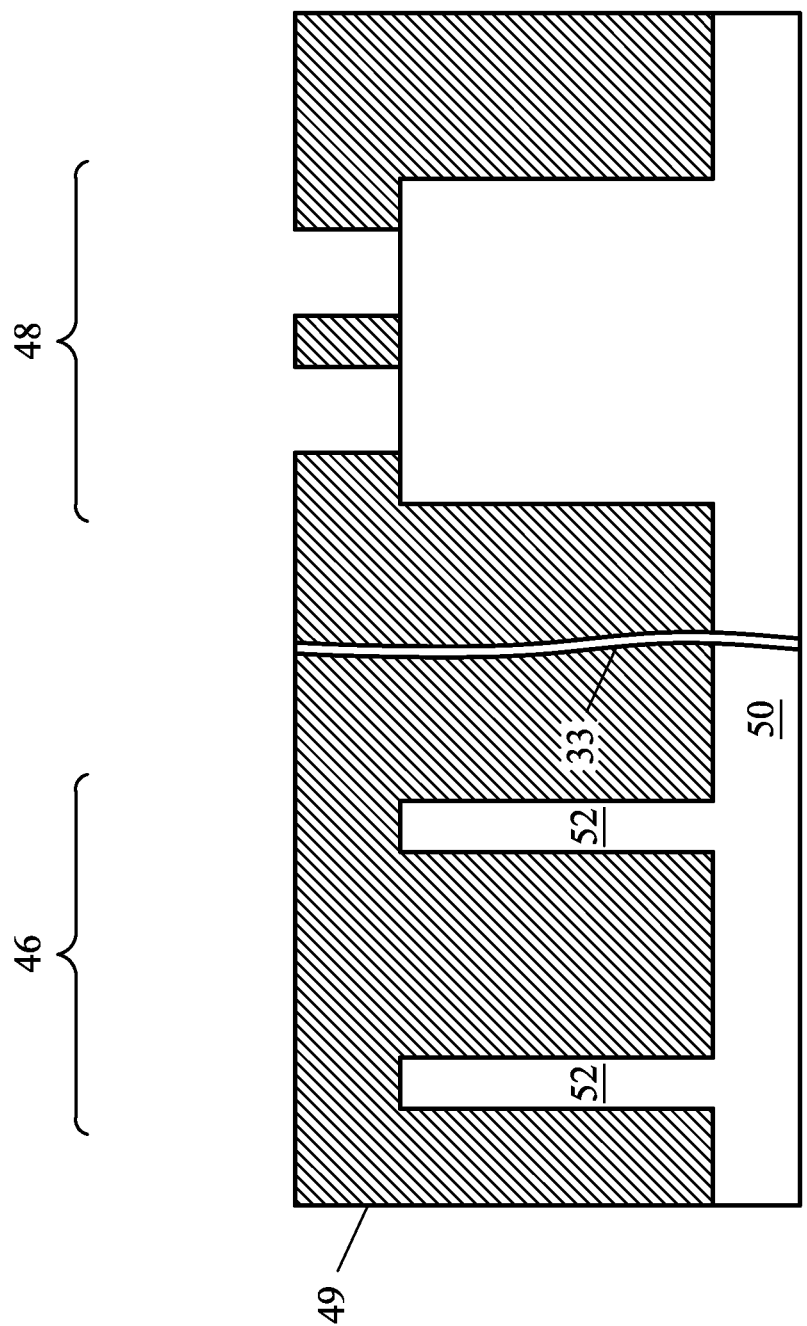
Figure 5:
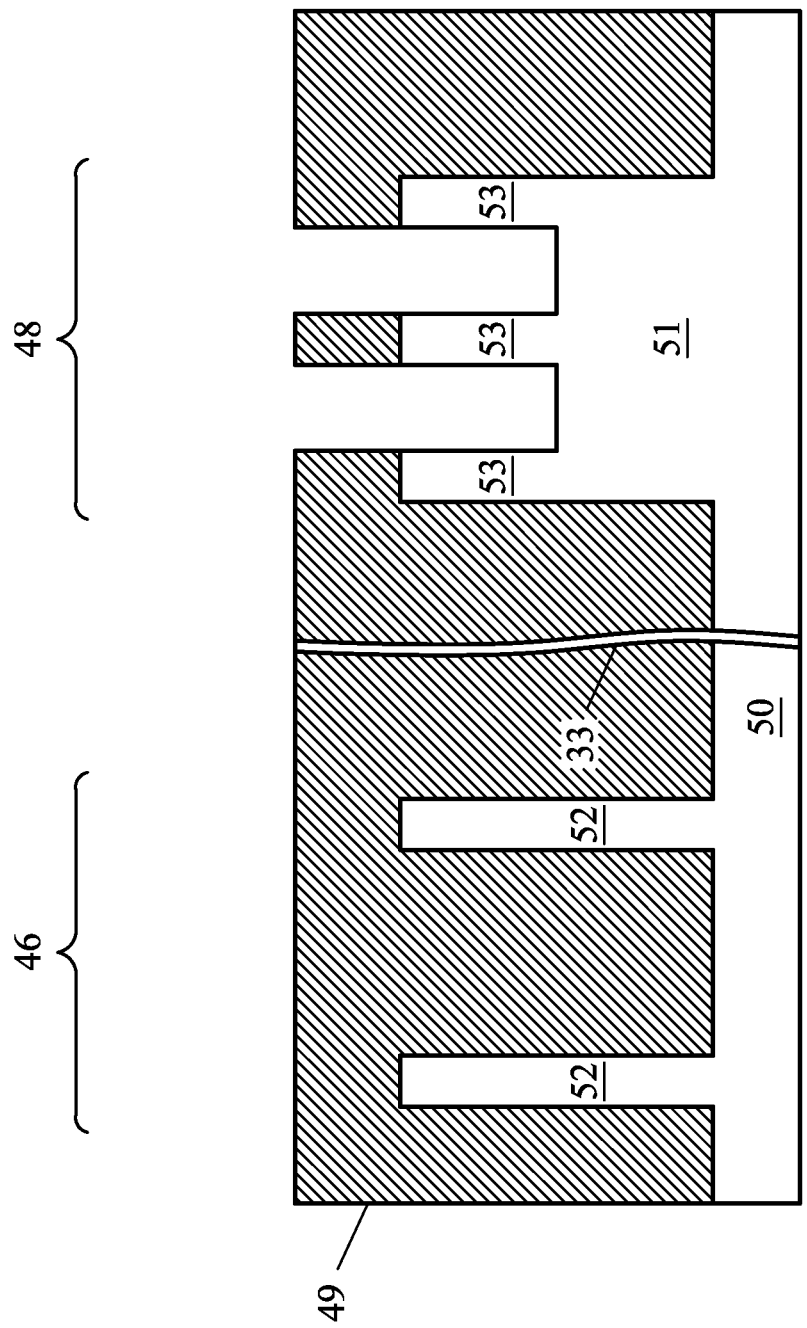

In FIG. 4, a hard mask layer 49 is formed over the structure illustrated in FIG. 3. The hard mask layer 49 may comprise silicon nitride, silicon oxynitride, silicon carbide, silicon carbo-nitride, or the like. In FIGS. 4 through 5, the hard mask layer 49 is patterned and used as an etching mask to further etch the substrate 50 and form the fins 53 in a second region 48 of the substrate 50. As a result, the semiconductor base 51 is formed. Although the fins 53 are illustrated in FIG. 5 as having linear edges, the fins 53 may have rounded edges or any other suitable shape.

Figure 6:
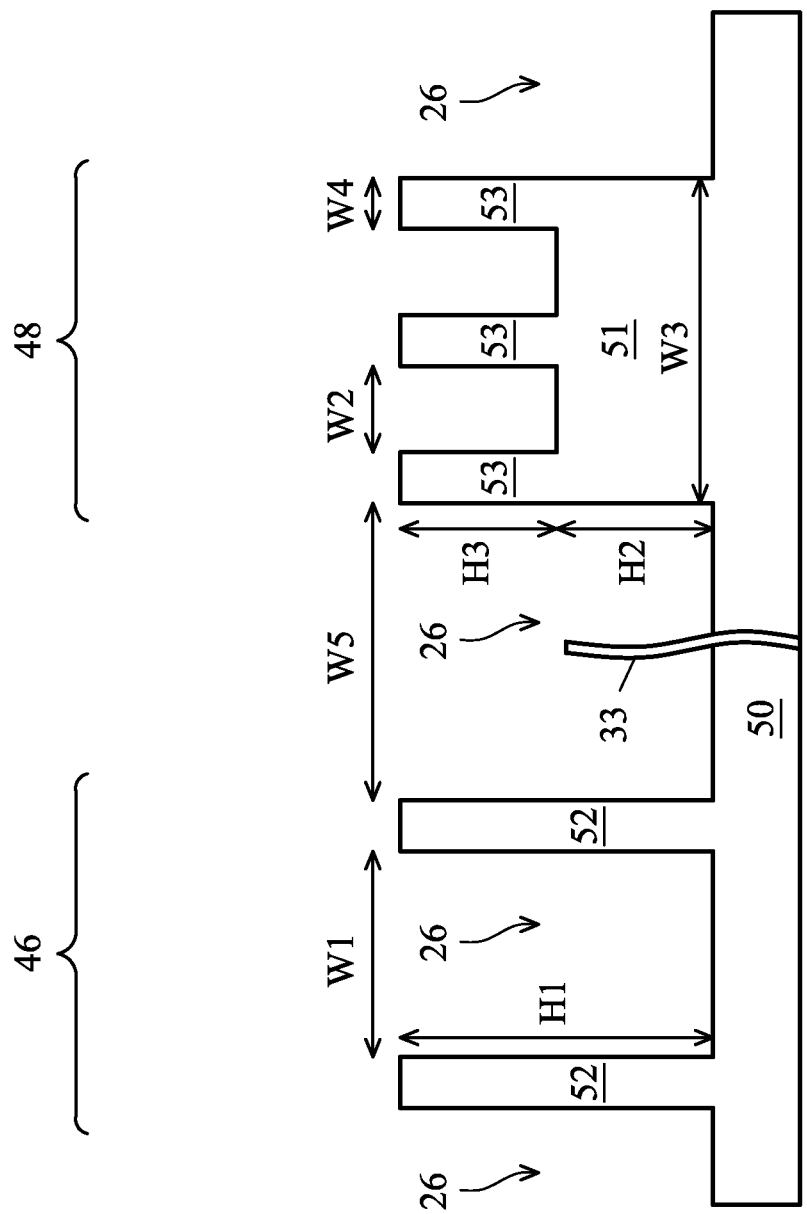

In FIG. 6, the hard mask layer 49 is removed by a suitable process. Although they seem adjacent, the first region 46 may be physically separated from the second region 48 (as illustrated by divider 33), and any number of device features (e.g., other active devices, doped regions, isolation structures, etc.) may be disposed between the first region 46 and the second region 48. The first region 46 comprises fins 52 and the second region 48 comprises fins 53, wherein the fins 52 and the fins 53 are semiconductor strips. In accordance with some embodiments of the present disclosure, the second region 48 may be referred to as having crown-shape fins. Second region 48 includes a semiconductor base 51 and the fins 53 over and extending upwards from the semiconductor base 51. Although FIG. 6 illustrates that there are two fins 52 and three fins 53, the number of the fins 52 and the fins 53 may be any integer number such as 1, 2, 3, 4, 5, or more.

The fins 52 and the fins 53 may be also be formed using alternate embodiments. These may include etching substrate 50 to form the fins 53, forming a sacrificial spacer layer to cover the sidewalls and the bottoms of the fins 53, and using the sacrificial spacer layers in combination with a hard mask as an etching mask to further etch substrate 50. As a result, the semiconductor base 51 is formed. The fins 52 have no sacrificial spacer layer formed on their sidewalls, and hence no semiconductor base is formed underneath. Rather, the top parts of the fins 52 may be formed simultaneously with the fins 53, and the bottom parts of the fins 52 are formed when the semiconductor base 51 is formed. The bottoms of the fins 52 thus may be substantially coplanar with the bottom of the semiconductor base 51. The sacrificial spacer layers are then removed. Other methods of forming the fins 52, the fins 53 and the semiconductor base 51 may be used as well.

The fins may be patterned by any suitable method. For example, the fins 52 and the fins 53 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52 and the fins 53.

In accordance with some embodiments of the present disclosure, the fins 52 may have a height H1 that may be in a range from about 100 nm to about 180 nm, or in a range from about 100 nm to about 200 nm. The semiconductor base 51 may have a height H2 that may be in a range from about 10 nm to about 60 nm, or in a range from about 10 nm to about 100 nm and the fins 53 may have a height H3 that may be in a range from about 40 nm to about 170 nm, or in a range from about 10 nm to 100 nm. Adjacent fins 52 in the first region 46 may have a width W1 between sidewalls of the adjacent fins 52 and adjacent fins 53 in the second region 48 may have a width W2 between sidewalls of the adjacent fins 53. The width W1 may be larger than the width W2. For example, a fin density of the fins 52 in the first region 46 may be less than a fin density of the fins 53 in the second region 48. The width W1 may be in a range from about 40 nm to about 200 nm and the Width W2 may be in a range from about 15 nm to about 40 nm. The semiconductor base 51 may have a width W3 that is in a range from about 40 nm to about 140 nm. Each of the fins 53 may have a width W4 that may be in a range from about 2 nm to about 20 nm. In addition, a width W5 between a sidewall of an outermost fin 52 in the first region 46 and a sidewall of an outermost fin in the second region 48 may be in a range from about 40 nm to about 100 nm. It has been observed that when the fins 52, the semiconductor base 51, and the fins 53 have the above height H1, H2, and H3 respectively, and adjacent fins 52 in the first region 46 have the above width W1 between sidewalls of the adjacent fins 52, and adjacent fins 53 in the second region 48 have the above width W2 between sidewalls of the adjacent fins 53, advantages can be achieved. For example, when the semiconductor base 51 has a height H2 that is larger than 10 nm or the fins 53 have a height H3 in a range from 30 nm to 100 nm, a portion of a subsequently formed first dielectric layer 54 in the second region 48 may be left unconverted after a conversion process (see FIG. 8A) to convert the first dielectric layer 54 in the first region 46 and the second region 48 to a second dielectric layer 55. As another example, when the semiconductor base 51 has a height H2 that is larger than 60 nm and larger than 100 nm, after the subsequent conversion process (see FIG. 8A) to convert the first dielectric layer 54 in the first region 46 and the second region 48 to the second dielectric layer 55, a difference between a second concentration of nitrogen in the second region 48 and a first concentration of nitrogen in the first region 46 may be higher than ten percent of the first concentration. As a result of the difference in nitrogen concentration, recessing of the second dielectric layer 55 may be uneven during an etch back process to define STI regions (see FIG. 11). Accordingly, manufacturing defects may result.

By adjusting the heights of the fins 52 and the fins 53, the thickness and depth uniformity of the subsequently converted second dielectric layer 55 (See FIG. 9) in the first region 46 and the second region 48 can be controlled and this allows for a complete conversion of the first dielectric layer 54 to the second dielectric layer 55 in both the first region 46 and the second region 48.

In some embodiments, the fins 53 and the fins 52 are roughly the same height. For example, the height H1 of the fins 52 may be equal to a sum of the height H2 of the semiconductor base 51 and the height H3 of the fins 53. A first recess interposed between adjacent fins 52 has the same or similar aspect ratio (H1/W1) with the aspect ratio (H3/W2) of a second recess interposed between adjacent fins 53. In some examples, the semiconductor base 51 may be lowered or even be omitted. For example, while the topmost surfaces of the fins 53 are lower than the topmost surfaces of the fins 52, the semiconductor base 51 may be lowered so that the second recess interposed between adjacent fins 53 has the same or smaller aspect ratio (H3/W2) than the aspect ratio (H1/W1) of a first recess interposed between adjacent fins 52. In accordance with alternate embodiments of the present disclosure, a difference in height between the fins 52 and the fins 53 is less than ten percent of the height of the fins 52.

Figure 7:
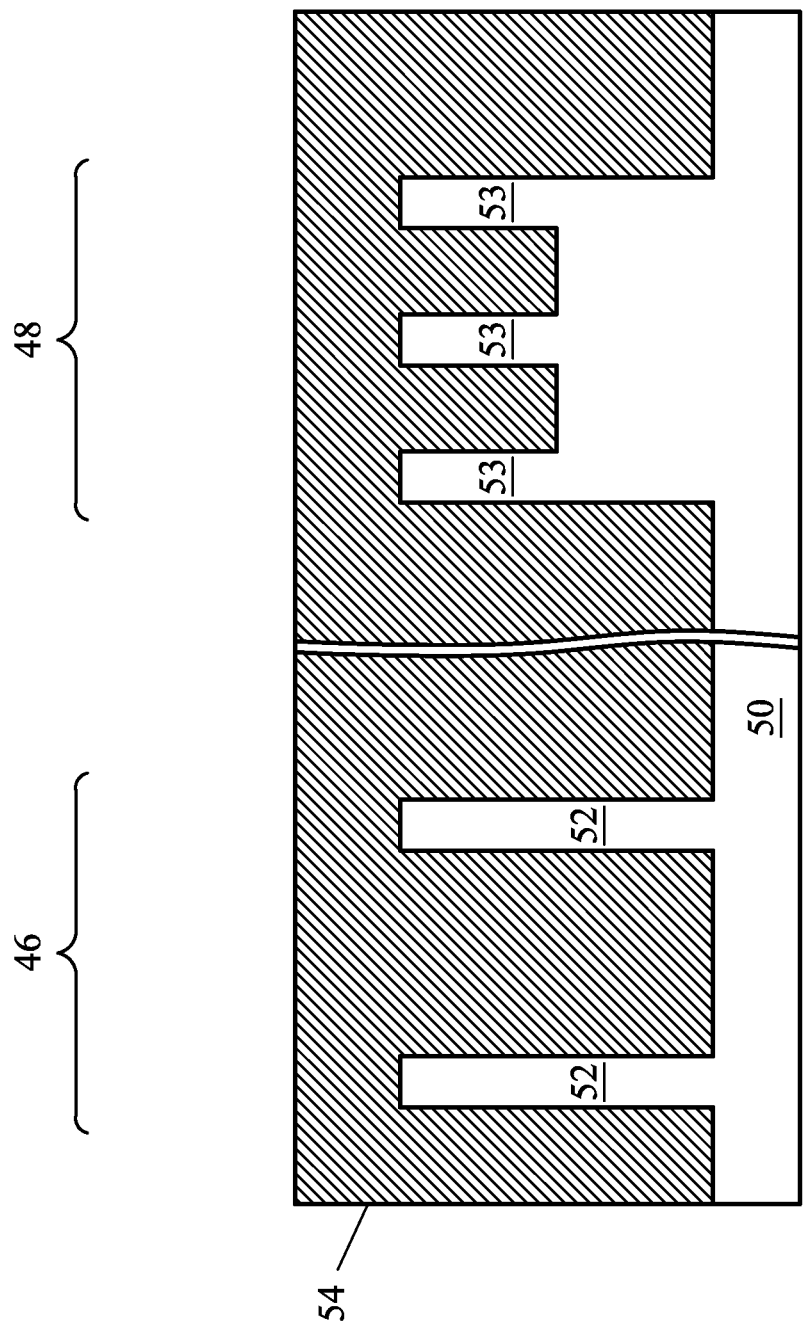

In FIG. 7, the first dielectric layer 54 is formed over the substrate 50 and between neighboring fins 52 and neighboring fins 53. The first dielectric layer 54 may be formed by a flowable CVD (FCVD) (e.g., a CVD-based material deposition in a remote plasma system and post curing to make it convert to another material, such as an oxide) process, or the like. In an embodiment, the first dielectric layer 54 is formed such that excess dielectric material of the first dielectric layer 54 covers the fins 52 and the fins 53. Although the first dielectric layer 54 is illustrated as a single layer, some embodiments may utilize multiple layers. For example, in some embodiments a liner (not shown) may first be formed along a surface of the substrate 50 and the fins 52 or the fins 53. Thereafter, a fill material, such as those discussed above may be formed over the liner.

The FCVD process to form the first dielectric layer 54 may comprise exposing the first region 46, the second region 48, and the substrate 50 to a silicon-containing precursor and a nitrogen-containing precursor. In some embodiments, the silicon-containing precursor is a polysilazane. Polysilazanes are polymers having a basic structure composed of silicon and nitrogen atoms in an alternating sequence. In polysilazanes, each silicon atom is usually bound to two nitrogen atoms, or each nitrogen atom is bound to two silicon atoms, so that these can be described predominantly as molecular chains of the formula $[R_1R_2Si-NR_3]_n$. $R_1$-$R_3$ can be hydrogen atoms or organic substituents.

In some embodiments, the silicon-containing precursor is a silylamine, such as trisilylamine (TSA), disilylamine (DSA), or a combination thereof. One or more carrier gases may also be included with the silicon-containing precursor. The carrier gases may include helium (He), argon (Ar), nitrogen ($N_2$), the like, or a combination thereof.

The nitrogen-containing precursor may include $NH_3$, $N_2$, the like, or a combination thereof. In some embodiments, the nitrogen-containing precursor is activated into plasma in a remote plasma system (RPS) outside of the deposition chamber. An oxygen source gas, such as $O_2$ or the like may be included with the nitrogen-containing precursor and activated into plasma in the RPS. Plasma generated in the RPS is carried into the deposition chamber by a carrier gas, which includes He, Ar, $N_2$, the like, or a combination thereof, in some embodiments.

The silicon-containing precursor and the nitrogen-containing precursor mix and react to deposit the first dielectric layer 54 containing silicon and nitrogen over the substrate 50 and between neighboring fins 52 and neighboring fins 53.

Figure 8A:
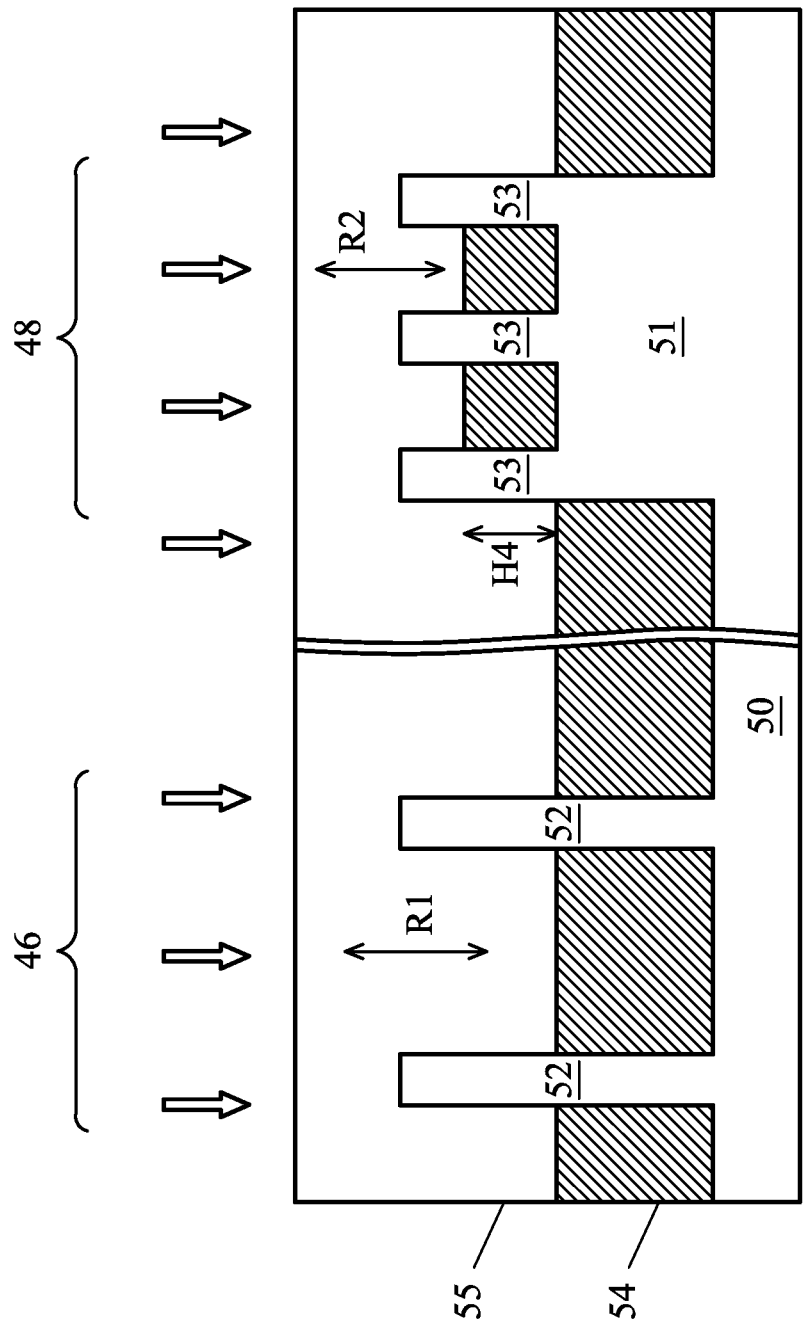

In FIG. 8A, an anneal process is illustrated to cure or treat the first dielectric layer 54, wherein the first dielectric layer 54 is converted, such as by an oxidation process. The oxidation process can include an anneal in an oxygen-containing ambient (e.g., steam). The conversion process can convert the first dielectric layer 54 to a second dielectric layer 55, which can be or include a silicon oxide (SiOx). In some embodiments, the anneal process may be a wet thermal anneal process performed at a temperature in a range from about 300° C. to about 700° C., and for a duration of several hours. In some embodiments, the wet thermal anneal process may be performed at a pressure in a range from about 400 Torr to about 760 Torr. In some embodiments, the wet anneal comprises wet steam that may be generated by use of a water vapor generator, water vaporizer, or combining hydrogen and oxygen gases in a torch unit.

The wet anneal process may help to break the Si—N and Si—H bond in the first dielectric layer 54 and promote the formation of Si—Si and Si—O bond, in some embodiments. The efficiency of conversion and the rate of conversion of the first dielectric layer 54 to the second dielectric layer 55 may be different in the first region 46 compared to the second region 48. The rate of depth conversion of the first dielectric layer 54 between two adjacent fins to the second dielectric layer 55 may be dependent on a width between the two adjacent fins, such that a larger width results in a higher rate of depth conversion. For example, the first region 46 may have a first rate of depth conversion R1 that is higher than a second rate of depth conversion R2 of the second region 48. The first rate of depth conversion R1 may be in a range from 7.75 to 700 nm/(min)$^{1/2}$ and the second rate of depth conversion R2 may be in a range of 6.2 to 600 nm/(min)$^{1/2}$. As a result a bottom surface of the converted second dielectric layer 55 in the second region 48 may be higher than a bottom surface of the converted second dielectric layer 55 in the first region 46 by a height H4.

In some embodiments, a concentration of nitrogen in the second dielectric layer 55 in the first region 46 and the second region 48 may be in a range from $1\times10^{19}$ atoms/cm$^3$ to $1\times10^{21}$ atoms/cm$^3$. In some embodiments, a concentration of nitrogen in the second dielectric layer 55 in the second region 48 may be within 10 percent of a concentration of nitrogen in the second dielectric layer 55 in the first region 46.

Figure 8B:
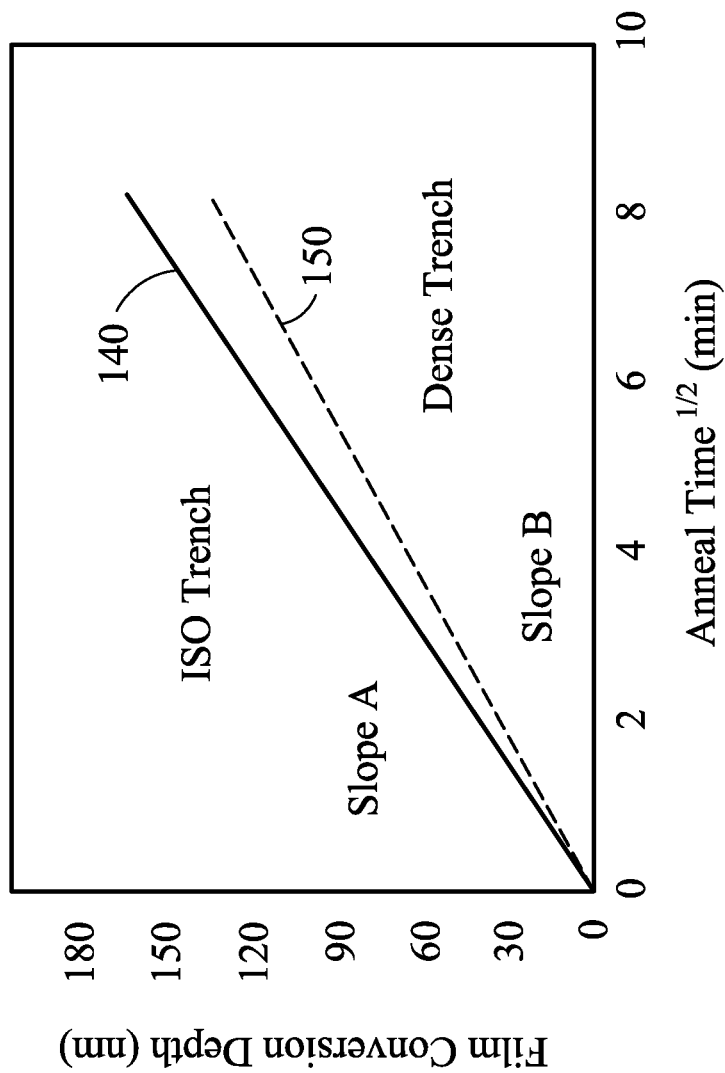
FIG. 8B shows dielectric layer conversion depth versus anneal time traces for an anneal process, in accordance with some embodiments.

FIG. 8B shows examples of first dielectric layer 54 conversion depth versus anneal time traces for the anneal process that converts the first dielectric layer 54 to the second dielectric layer 55 as described above in FIG. 8A. The trace 140 corresponds to a slope A that describes a conversion rate for the first dielectric layer 54 between a pair of adjacent fins that may be in the first region 46 while the trace 150 corresponds to a slope B that describes a conversion rate for the first dielectric layer 54 between a pair of adjacent fins that may be in the second region 48. A conversion rate of the first dielectric layer 54 between two adjacent fins to the second dielectric layer 55 may be dependent on a width between the two adjacent fins, such that a larger width results in a higher conversion rate. A fin density of the fins 52 in the first region 46 may be less than a fin density of the fins 53 in the second region 48 and a width between two adjacent fins 52 in the first region 46 may be larger than a width between two adjacent fins 53 in the second region 48. A conversion rate (shown by the trace 140) of the first dielectric layer 54 between the pair of adjacent fins 52 in the first region 46 is higher than a conversion rate (shown by the trace iso) of the first dielectric layer 54 between the pair of adjacent fins 53 in the second region 48.

Figure 9:
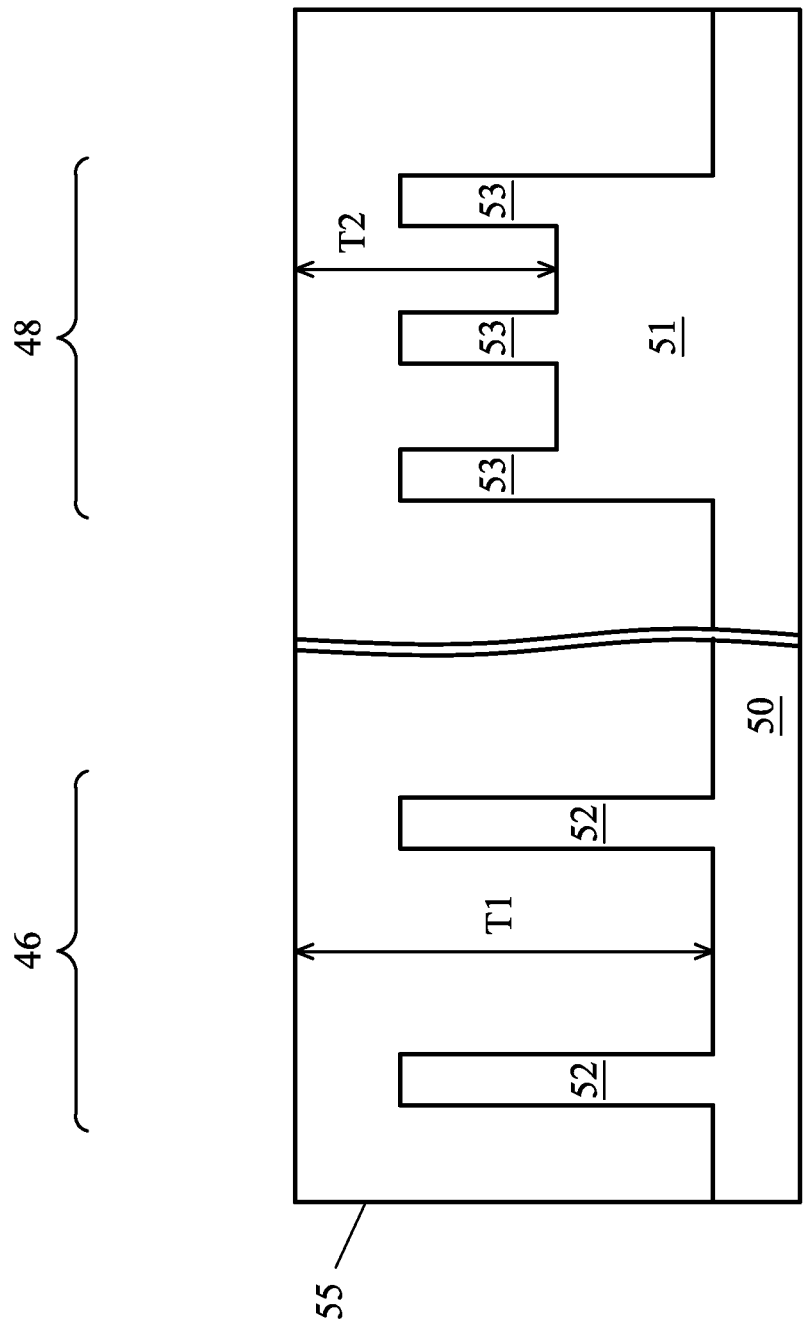
FIGS. 9, 10, 11, 12, 13, 14A, 14B, 15A, 15B, 16A, 16B, 16C, 16D, 17A, 17B, 18A, 18B, 19A, 19B, 20A, 20B, 20C, 21A, 21B, 22A, and 22B are cross-sectional views of intermediate stages in the manufacturing of FinFETs, in accordance with some embodiments.

FIG. 9 illustrates a cross-sectional view of an intermediate stage in the formation of a FinFET after completion of an anneal process to convert the first dielectric layer 54 to the second dielectric layer 55. The embodiments of the present disclosure describe a process that results in the second dielectric layer 55 in the first region 46 and the second region 48 having a more uniform dielectric quality and composition. A conversion time for the entire thickness T1 of the converted second dielectric layer 55 in the first region 46 and a conversion time for the entire thickness T2 of the converted second dielectric layer 55 in the second region 48 can be controlled to within 10 percent. In some embodiments the conversion of the entire first dielectric layer 54 in the first region 46 to the second dielectric layer 55 and the conversion of the entire first dielectric layer 54 in the second region 48 to the second dielectric layer 55 can be controlled to end at the same time. This is achieved by using the structure described above in FIG. 6, where the fins 52 have a height H1 that may be in a range from about 100 nm to about 180 nm, or in a range from about 100 nm to about 200 nm, the semiconductor base 51 in the second region 48 has a height H2 that may be in a range from about 10 nm to about 60 nm, or in a range from about 10 nm to about 100 nm, and the fins 53 in the second region 48 have a height H3 that may be in a range from about 40 nm to about 170 nm, or in a range from about 10 nm to about 100 nm. The structure and specific dimensions described above in FIG. 6 compensate for a difference in a conversion rate of the first dielectric layer 54 between adjacent fins 52 in the first region 46 and a conversion rate of the first dielectric layer 54 between adjacent fins 53 in the second region 48. The semiconductor base 51 reduces a thickness of the first dielectric layer 54 in the second region 48 by an amount equal to height H2 and therefore reduces a conversion time needed to convert the entire first dielectric layer 54 in the second region 48 to the second dielectric layer 55. This reduced conversion time to convert the entire first dielectric layer 54 in the second region 48 to the second dielectric layer 55 is then able to match a conversion time needed to convert the entire first dielectric layer 54 in the first region 46 to the second dielectric layer 55, despite a faster conversion rate of the first dielectric layer 54 in the first region 46. In addition, since the anneal process to convert the first dielectric layer 54 to the second dielectric layer 55 in both the first region 46 and the second region 48 takes a same amount of time, a more uniform dielectric quality and composition of the second dielectric layer 55 is achieved between the first region 46 and the second region 48. For example, a concentration of nitrogen in the second dielectric layer 55 in the second region 48 may be within 10 percent of a concentration of nitrogen in the second dielectric layer 55 in the first region 46.

Figure 10:
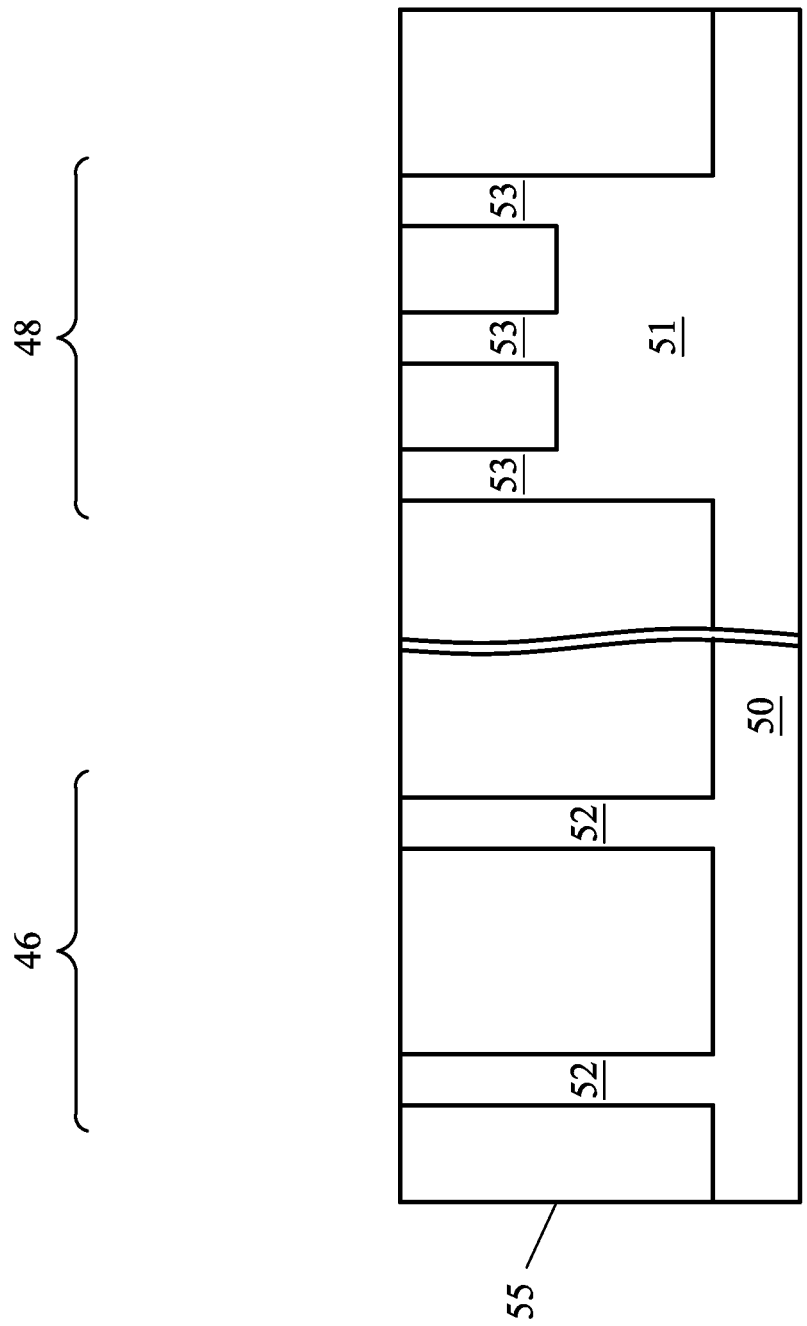

In FIG. 10, a removal process is applied to the second dielectric layer 55 to remove excess material of the second dielectric layer 55 over the fins 52 and the fins 53. In some embodiments, a planarization process such as a chemical mechanical polish (CMP), an etch-back process, combinations thereof, or the like may be utilized. The planarization process exposes the fins 52 and the fins 53 such that top surfaces of the fins 52 and the fins 53 and the second dielectric layer 55 are level after the planarization process is complete. In embodiments in which a mask remains on the fins 52 and the fins 53, the planarization process may expose the mask or remove the mask such that top surfaces of the mask or the fins 52 and the fins 53, respectively, and the second dielectric layer 55 are level after the planarization process is complete.

Figure 11:
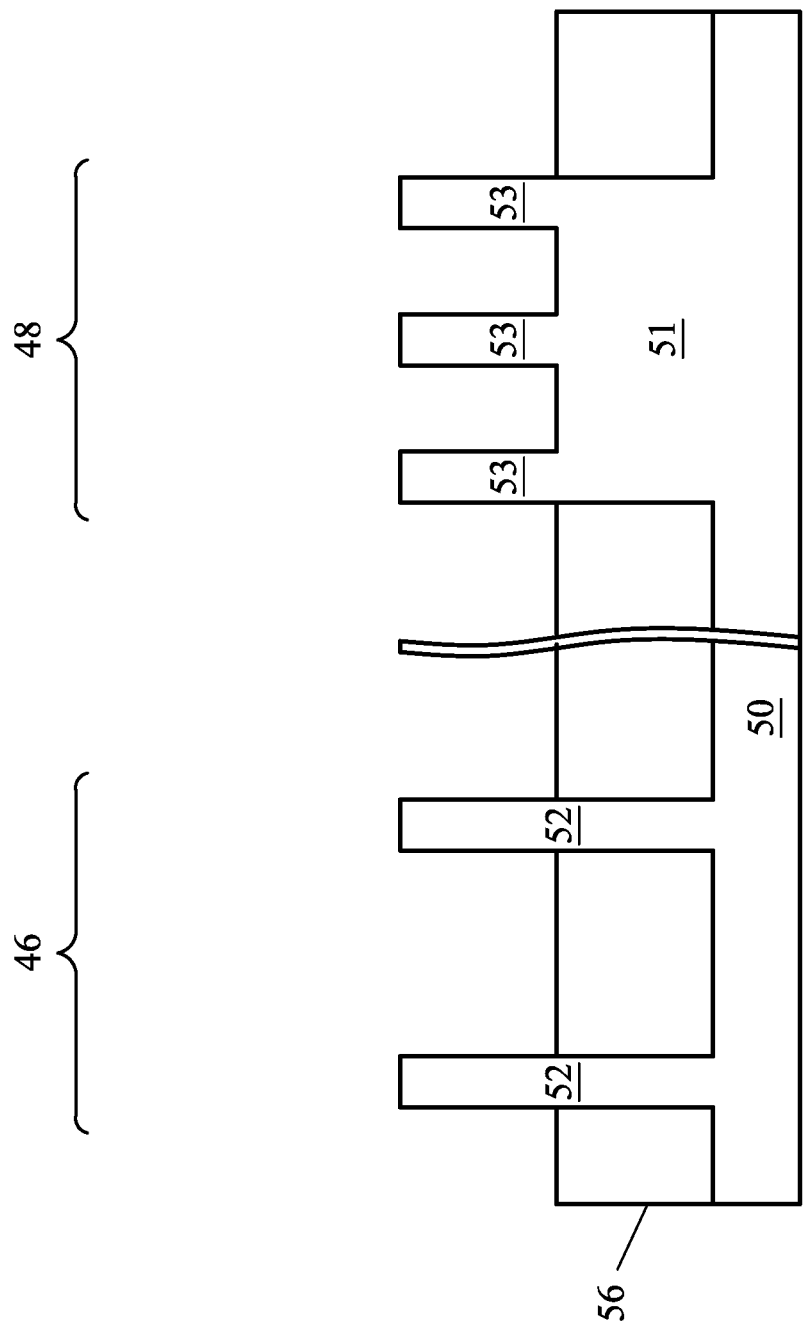

In FIG. 11, the second dielectric layer 55 is recessed to form Shallow Trench Isolation (STI) regions 56. The second dielectric layer 55 is recessed such that upper portions of the fins 52 and the fins 53 in the first region 46 and the second region 48 respectively, protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the second dielectric layer 55 (e.g., etches the material of the second dielectric layer 55 at a faster rate than the material of the fins 52 and the fins 53). For example, an oxide removal using, for example, dilute hydrofluoric (dHF) acid may be used. The etch rate of the second dielectric layer 55 in the first region 46 and the second region 48 is dependent on the dielectric layer quality and composition in each of the regions 46 and 48. The embodiments of the present disclosure describe a process that results in the second dielectric layer 55 in the first region 46 and the second region 48 having a more uniform quality and composition. This allows etch rate uniformity and control in the first region 46 and the second region 48. As a result, a height of the fins 52 and 53 that protrude from above the STI regions 56 may be controlled more precisely, and yield can be increased. In some embodiments a top surface of the STI regions 56 may be at a same level as a bottom of a recess interposed between adjacent fins 53 in the second region 48.

Figure 12:
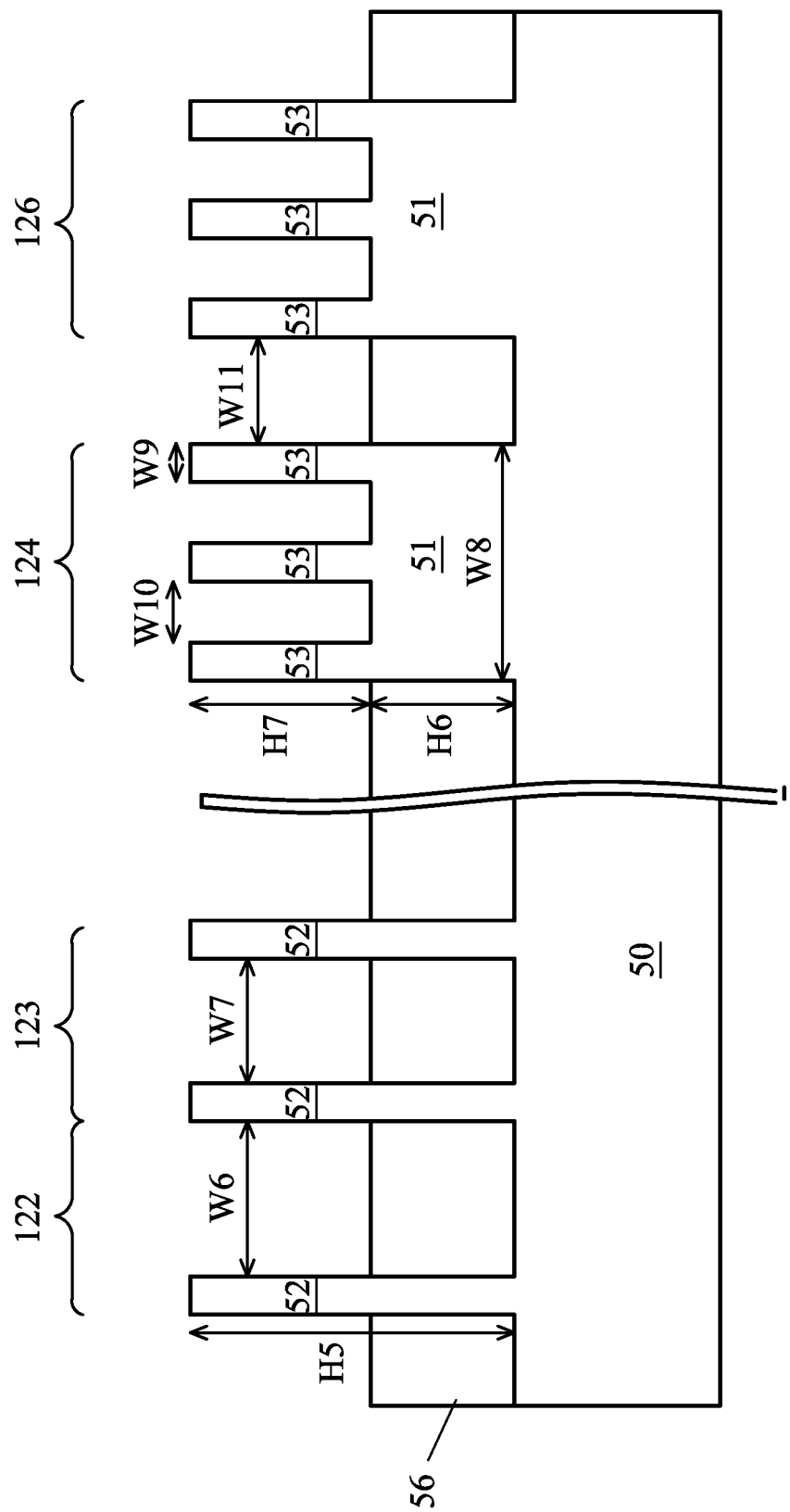

FIG. 12 shows a cross-sectional view of an intermediate stage in the manufacturing of FinFETs, in accordance with alternate embodiments. FIG. 12 shows fins 52 in a first region 122 and a second region 123 of the substrate 50 and fins 53 in a third region 124 and a fourth region 126 of the substrate 50. The fins 52 in the first region 122 and the second region 123 may have a height H5 that may be in a range from about 100 nm to about 180 nm, or in a range from about 100 nm to about 200 nm. The semiconductor base 51 in the third region 124 and the fourth region 126 may have a height H6 that may be in a range from about 10 nm to about 60 nm, or in a range from about 10 nm to about 100 nm and the fins 53 in the third region 124 and the fourth region 126 may have a height H7 that may be in a range from about 40 nm to about 170 nm, or in a range from about 10 nm to 100 nm. Adjacent fins 52 in the first region 122 may have a width W6 between sidewalls of the adjacent fins 52 in the first region 122 and adjacent fins 52 in the second region 123 may have a width W7 between sidewalls of the adjacent fins 52 in the second region 123. The width W6 may be in a range from about 100 nm to about 300 nm and the Width W7 may be in a range from about 40 nm to about 200 nm. The semiconductor base 51 in the third region 124 and the fourth region 126 may have a width W8 that is in a range from about 40 nm to about 140 nm. Each of the fins 53 may have a width W9 that may be in a range from about 2 nm to about 20 nm. Adjacent fins 53 in the third region 124 and the fourth region 126 may have a width W10 between sidewalls of the adjacent fins 53 that is in a range from about 15 nm to about 40 nm. In addition, a width W11 between a sidewall of an outermost fin 53 in the third region 124 and a sidewall of an outermost fin 53 in the fourth region 126 may be in a range from about 40 nm to about 100 nm.

In FIG. 12, the second dielectric layer 55 is recessed to form Shallow Trench Isolation (STI) regions 56. The second dielectric layer 55 is recessed such that upper portions of the fins 52 in the first region 122 and the second region 123, and upper portions of the fins 53 in the third region 124 and the fourth region 126, protrude from between neighboring STI regions 56. The etch rate of the second dielectric layer 55 in the first region 122, the second region 123, the third region 124, and the fourth region 126 is dependent on the dielectric layer quality and composition in each of the regions 122, 123, 124, and 126. The embodiments of the present disclosure describe a process that results in the second dielectric layer 55 in the first region 122, the second region 123, the third region 124, and the fourth region 126 having a more uniform quality and composition. This allows etch rate uniformity and control in the first region 122, the second region 123, the third region 124, and the fourth region 126. As a result, a height of the fins 52 and 53 that protrude from above the STI regions 56 may be controlled more precisely, and yield can be increased.

The process described with respect to FIGS. 2 through 11 is just one example of how the fins 52 and the fins 53 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52 and the fins 53. For example, the fins 52 and the fins 53 in FIG. 10 can be recessed, and a material different from the fins 52 and the fins 53 may be epitaxially grown over the recessed fins 52 and the fins 53. In such embodiments, the fins 52 and the fins 53 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52 and the fins 53. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in an n-type region (e.g., an NMOS region) different from the material in a p-type region (e.g., a PMOS region). In various embodiments, upper portions of the fins 52 and the fins 53 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 11, appropriate wells (not shown) may be formed in the fins 52, the fins 53 and/or the substrate 50. In the embodiments with different well types, the different implant steps for the n-type region (not shown) and the p-type region (not shown) may be achieved using a photoresist and/or other masks (not shown). The photoresist is patterned to expose the p-type region of the substrate 50. The photoresist can be formed by using a spin-on technique and can be patterned using acceptable photolithography techniques. Once the photoresist is patterned, an n-type impurity implant may be performed in the p-type region, and the photoresist may act as a mask to substantially prevent n-type impurities from being implanted into the n-type region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region, a photoresist is formed over the fins 52, the fins 53 and the STI regions 56 in the p-type region (not shown). The photoresist is patterned to expose the n-type region (not shown) of the substrate 50. The photoresist can be formed by using a spin-on technique and can be patterned using acceptable photolithography techniques. Once the photoresist is patterned, a p-type impurity implant may be performed in the n-type region, and the photoresist may act as a mask to substantially prevent p-type impurities from being implanted into the p-type region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region (not shown) and the p-type region (not shown), an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 13:
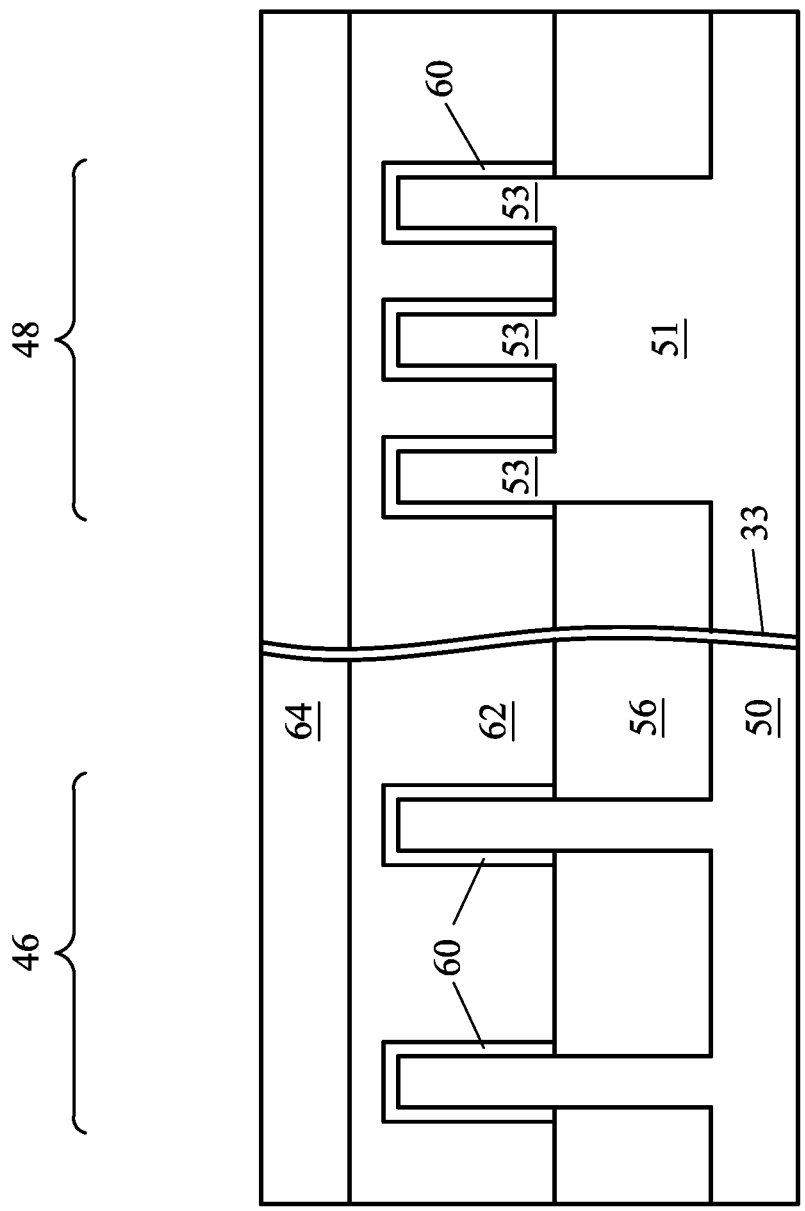

FIGS. 13, 14A, 15A, 16A, 17A, 18A, 19A, 20A, 21A, and 22A show the first region 46 and the second region 48 which are not meant to be continuous. Although they seem adjacent the first region 46 may be physically separated from the second region 48 (as illustrated by divider 33), and any number of device features (e.g., other active devices, doped regions, isolation structures, etc.) may be disposed between the first region 46 and the second region 48. In FIG. 13, a dummy dielectric layer 60 is formed on the fins 52 and the fins 53. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the fins 52, the fins 53, and the substrate 50. It is noted that the dummy dielectric layer 60 is shown covering only the fins 52 and the fins 53 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

Figures 14A, 14B:
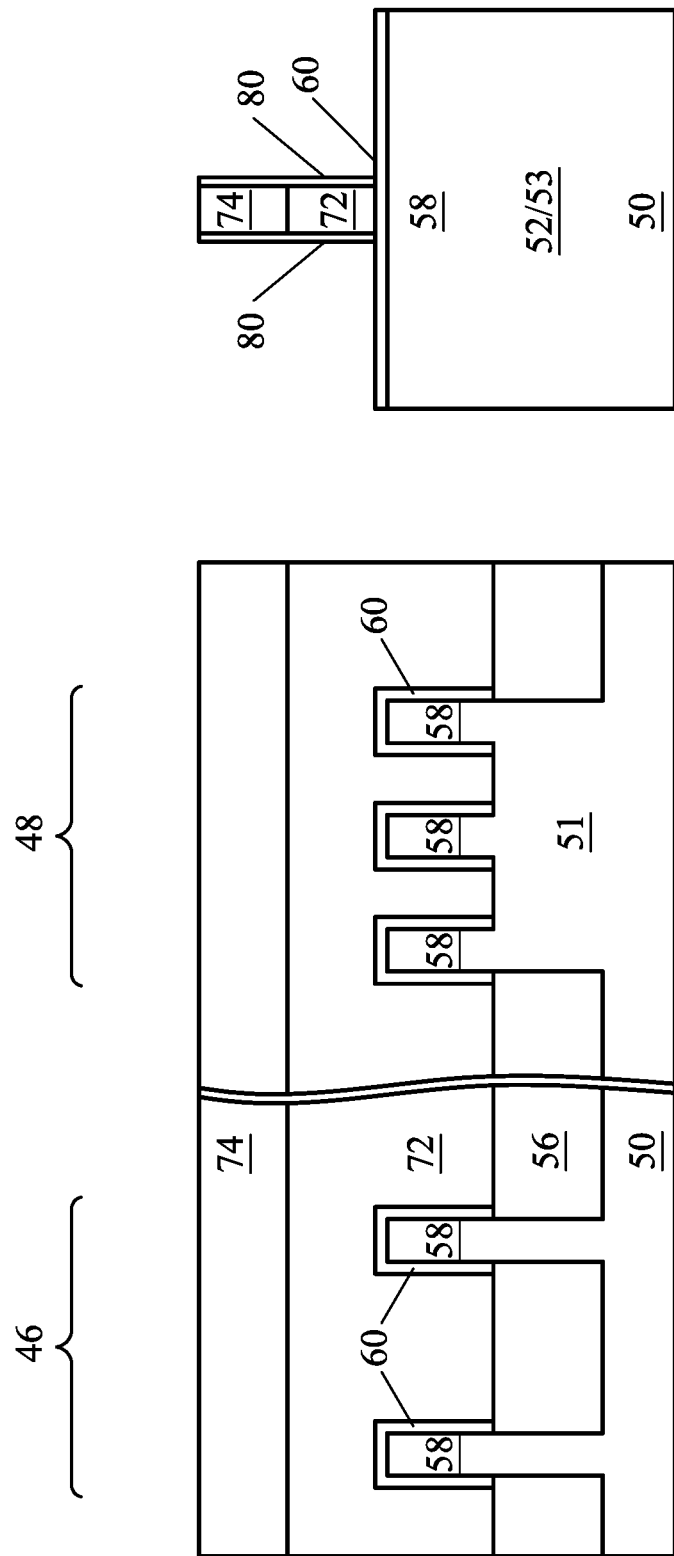

In FIGS. 14A and 14B, the mask layer 64 (see FIG. 13) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52 and the fins 53. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52 and fins 53.

Further in FIGS. 14A and 14B, gate seal spacers 80 can be formed on exposed surfaces of the dummy gates 72, the masks 74, and/or the fins 52 and the fins 53. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 11, a mask, such as a photoresist, may be formed over an n-type region, while exposing a p-type region, and appropriate type (e.g., p-type) impurities may be implanted into the exposed fins 52 and the exposed fins 53 in the p-type region. The mask may then be removed. Subsequently, a mask, such as a photoresist, may be formed over the p-type region while exposing the n-type region, and appropriate type impurities (e.g., n-type) may be implanted into the exposed fins 52 and the exposed fins 53 in the n-type region. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 15B:
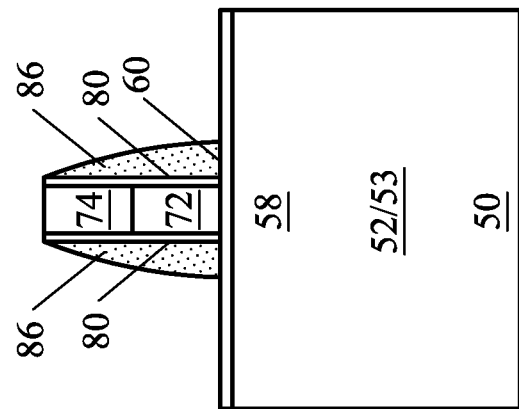
Figure 15A:
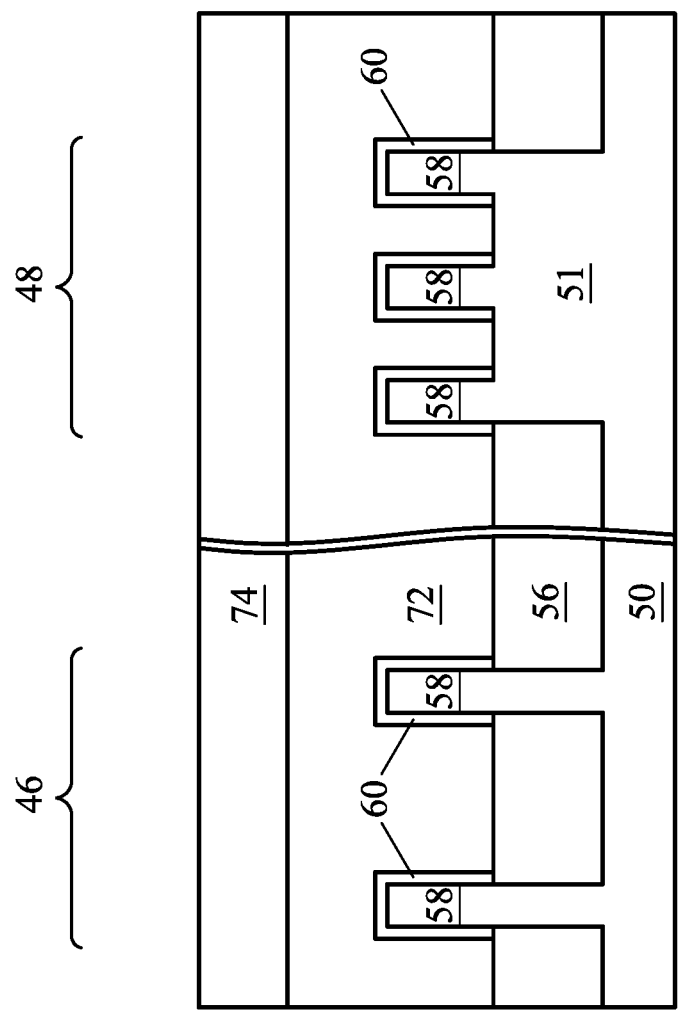

In FIGS. 15A and 15B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 16B:
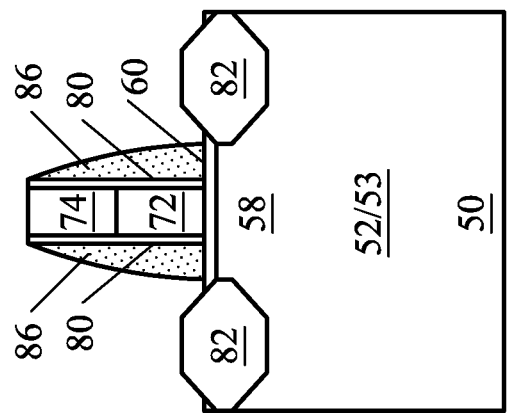
Figure 16A:
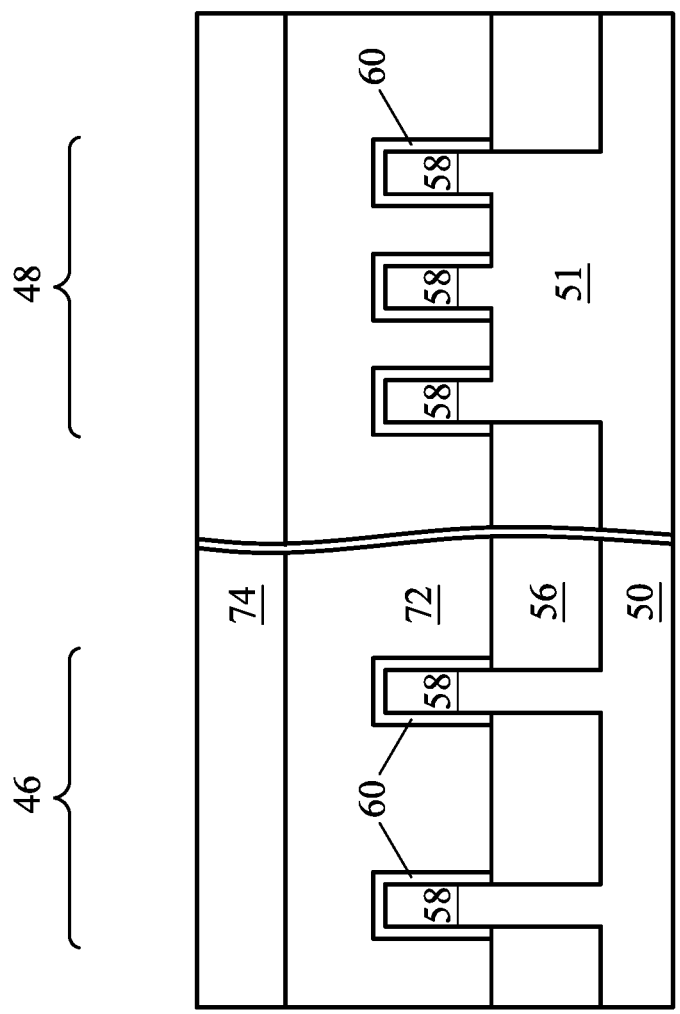
Figure 16C:
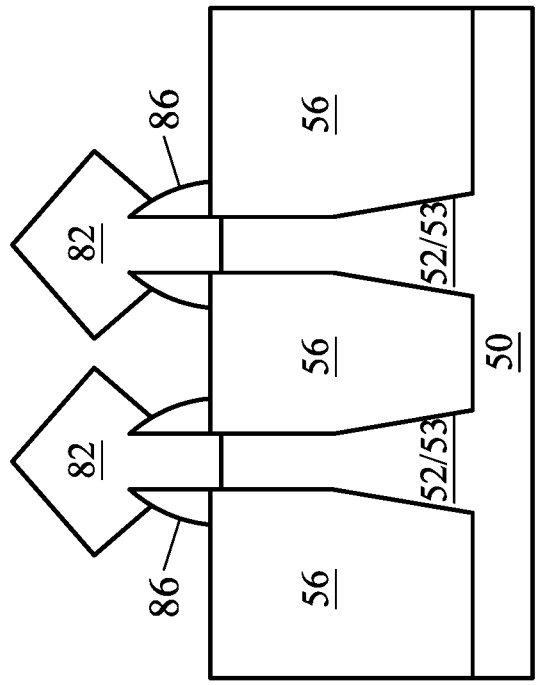
Figure 16D:
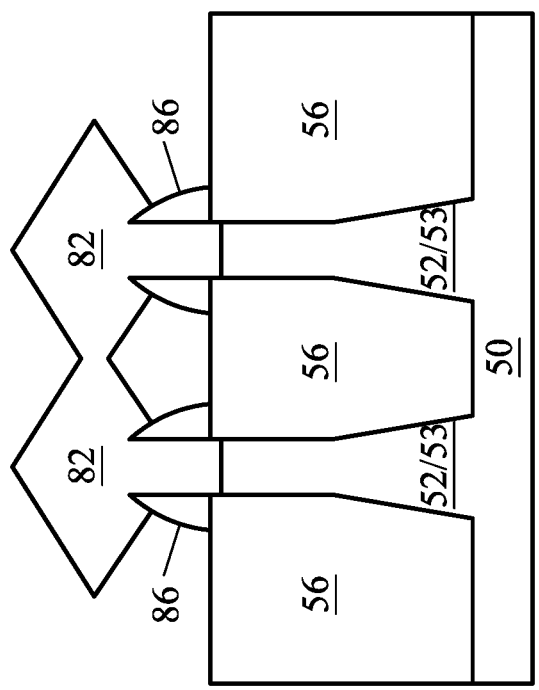

In FIGS. 16A and 16B epitaxial source/drain regions 82 are formed in the fins 52 and the fins 53. The epitaxial source/drain regions 82 are formed in the fins 52 and the fins 53 such that each dummy gate 72 is disposed between respective neighboring pairs of the epitaxial source/drain regions 82. In some embodiments the epitaxial source/drain regions 82 may extend into, and may also penetrate through, the fins 52 and the fins 53. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in an n-type region may be formed by masking a p-type region and etching source/drain regions of the fins 52 and the fins 53 in the n-type region to form recesses in the fins 52 and the fins 53. FIGS. 16A and 16B may be applied to either the n-type region or the p-type region. Then, the epitaxial source/drain regions 82 in the n-type region are epitaxially grown in the recesses. The epitaxial source/drain regions 82 may include any acceptable material, such as appropriate for n-type FinFETs. For example, if the fin 52 and the fin 53 is silicon, the epitaxial source/drain regions 82 in the n-type region may include materials exerting a tensile strain in the channel region 58, such as silicon, silicon carbide, phosphorous doped silicon carbide, silicon phosphide, or the like. The epitaxial source/drain regions 82 in the n-type region may have surfaces raised from respective surfaces of the fins 52 and the fins 53 and may have facets.

The epitaxial source/drain regions 82 in the p-type region may be formed by masking the n-type region and etching source/drain regions of the fins 52 and the fins 53 in the p-type region to form recesses in the fins 52 and the fins 53. Then, the epitaxial source/drain regions 82 in the p-type region are epitaxially grown in the recesses. The epitaxial source/drain regions 82 may include any acceptable material, such as appropriate for p-type FinFETs. For example, if the fin 52 and the fin 53 is silicon, the epitaxial source/drain regions 82 in the p-type region may comprise materials exerting a compressive strain in the channel region 58, such as silicon-germanium, boron doped silicon-germanium, germanium, germanium tin, or the like. The epitaxial source/drain regions 82 in the p-type region may have surfaces raised from respective surfaces of the fins 52 and the fins 53 and may have facets.

The epitaxial source/drain regions 82 and/or the fins 52 and the fins 53 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region and the p-type region, upper surfaces of the epitaxial source/drain regions have facets which expand laterally outward beyond sidewalls of the fins 52 and the fins 53. In some embodiments, these facets cause adjacent source/drain regions 82 of a same FinFET to merge as illustrated by FIG. 16C. In other embodiments, adjacent source/drain regions 82 remain separated after the epitaxy process is completed as illustrated by FIG. 16D. In the embodiments illustrated in FIGS. 16C and 16D, gate spacers 86 are formed covering a portion of the sidewalls of the fins 52 and the fins 53 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 17B:
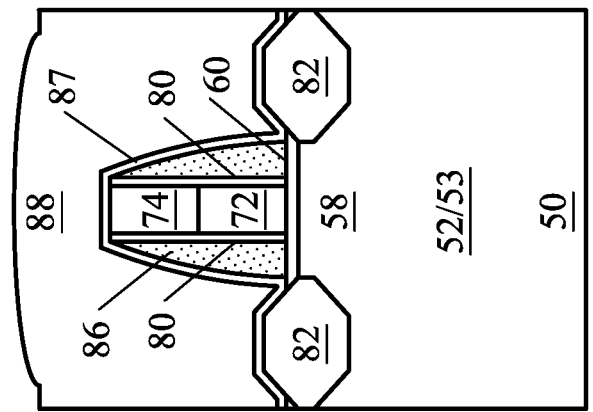
Figure 17A:
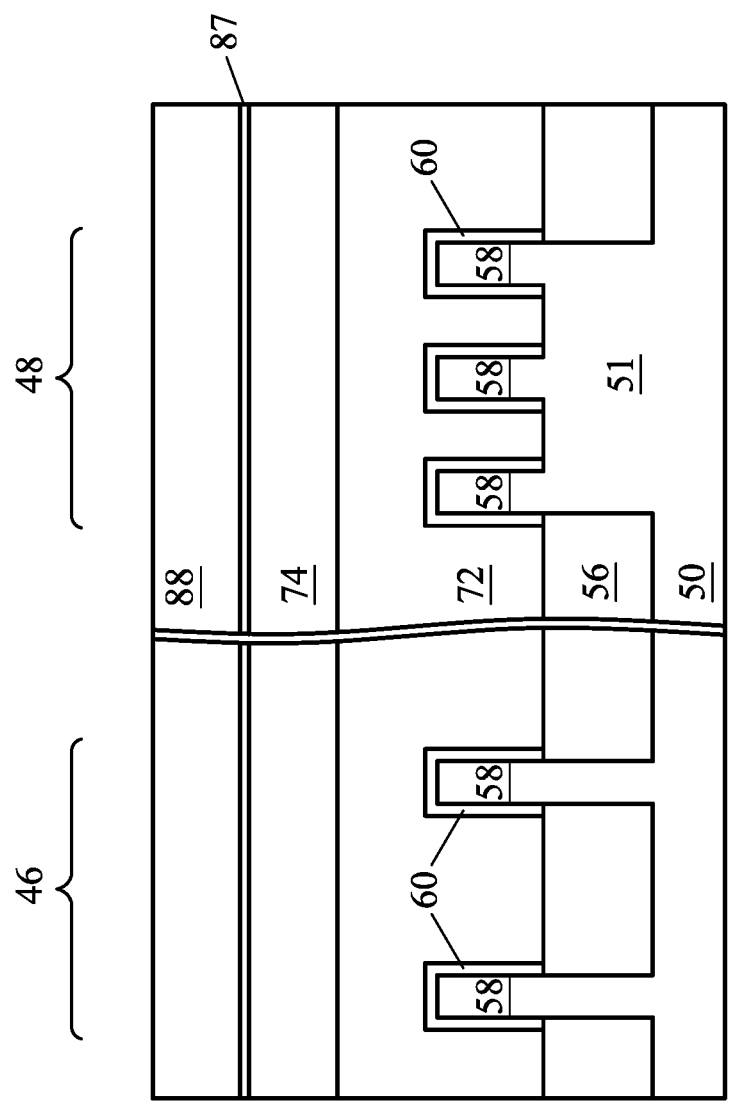

In FIGS. 17A and 17B, a first interlayer dielectric (ILD) 88 is deposited over the structure illustrated in FIGS. 16A and 16B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 18A:
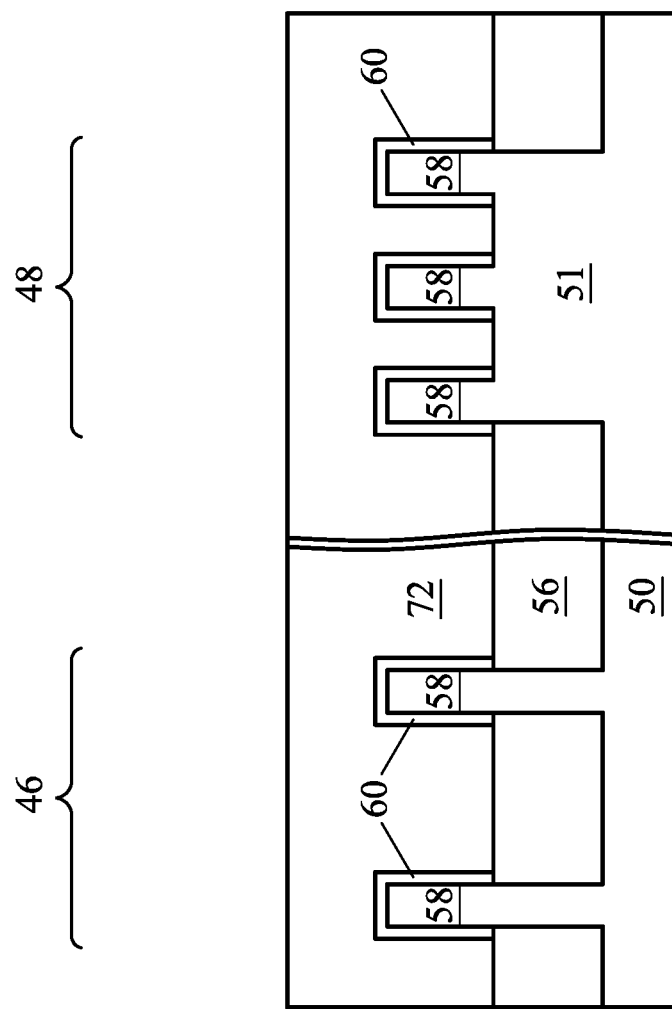
Figure 18B:
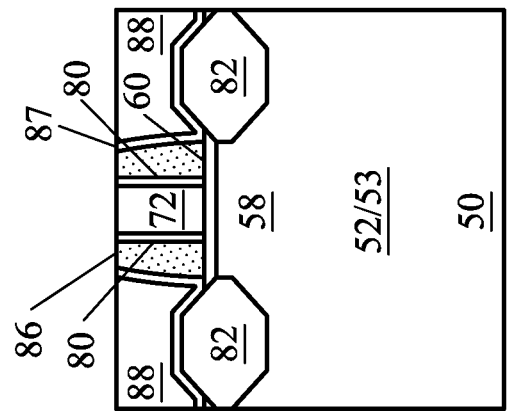

In FIGS. 18A and 18B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 19B:
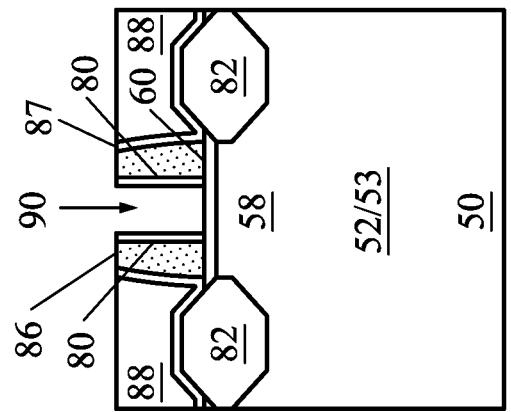
Figure 19A:
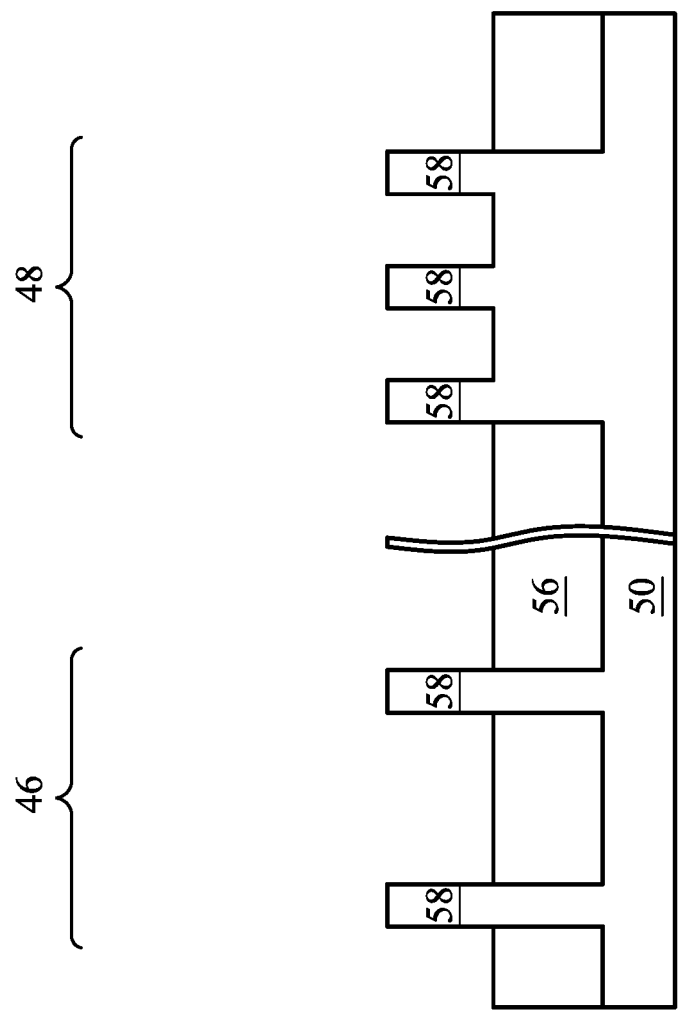

In FIGS. 19A and 19B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52 or fin 53. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figures 20A, 20B:
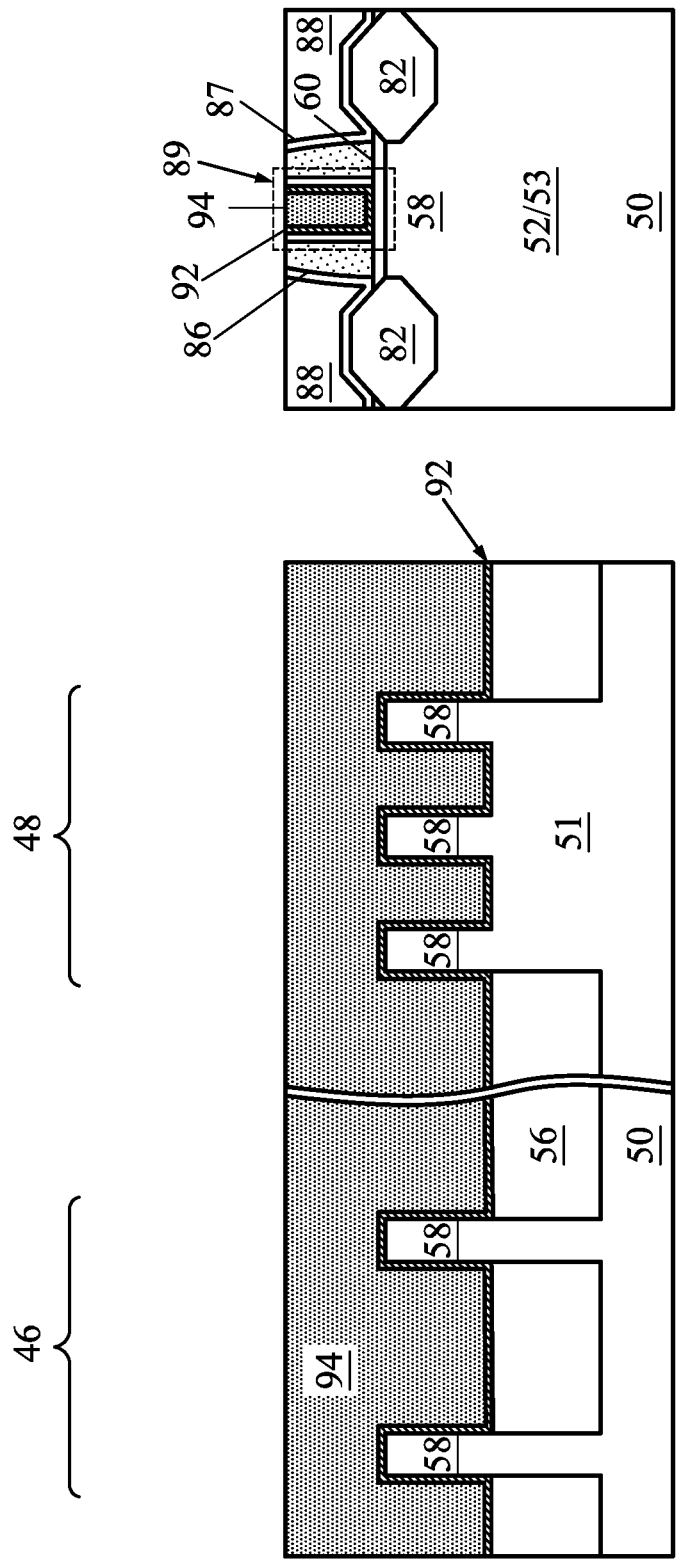
Figure 20C:
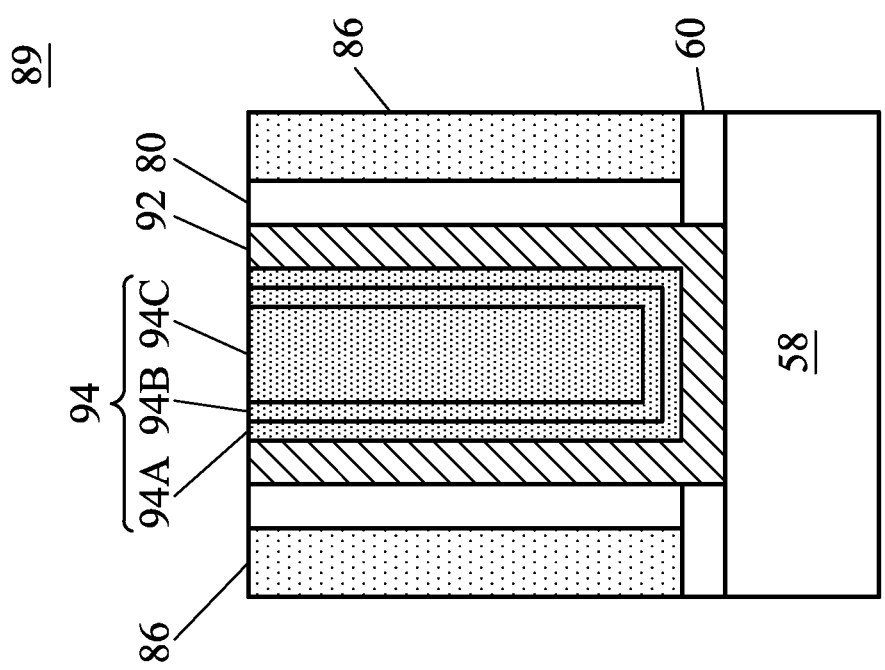

In FIGS. 20A and 20B, gate dielectric layers 92 and gate electrodes 94 are formed for replacement gates. FIG. 20C illustrates a detailed view of region 89 of FIG. 20B. Gate dielectric layers 92 are deposited conformally in the recesses 90, such as on the top surfaces and the sidewalls of the fins 52 and the fins 53 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 20B, the gate electrode 94 may comprise any number of liner layers 94A, any number of work function tuning layers 94B, and a fill material 94C as illustrated by FIG. 20C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52 and the fins 53.

The formation of the gate dielectric layers 92 in an n-type region (not shown) and a p-type region (not shown) may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figures 21A, 21B:
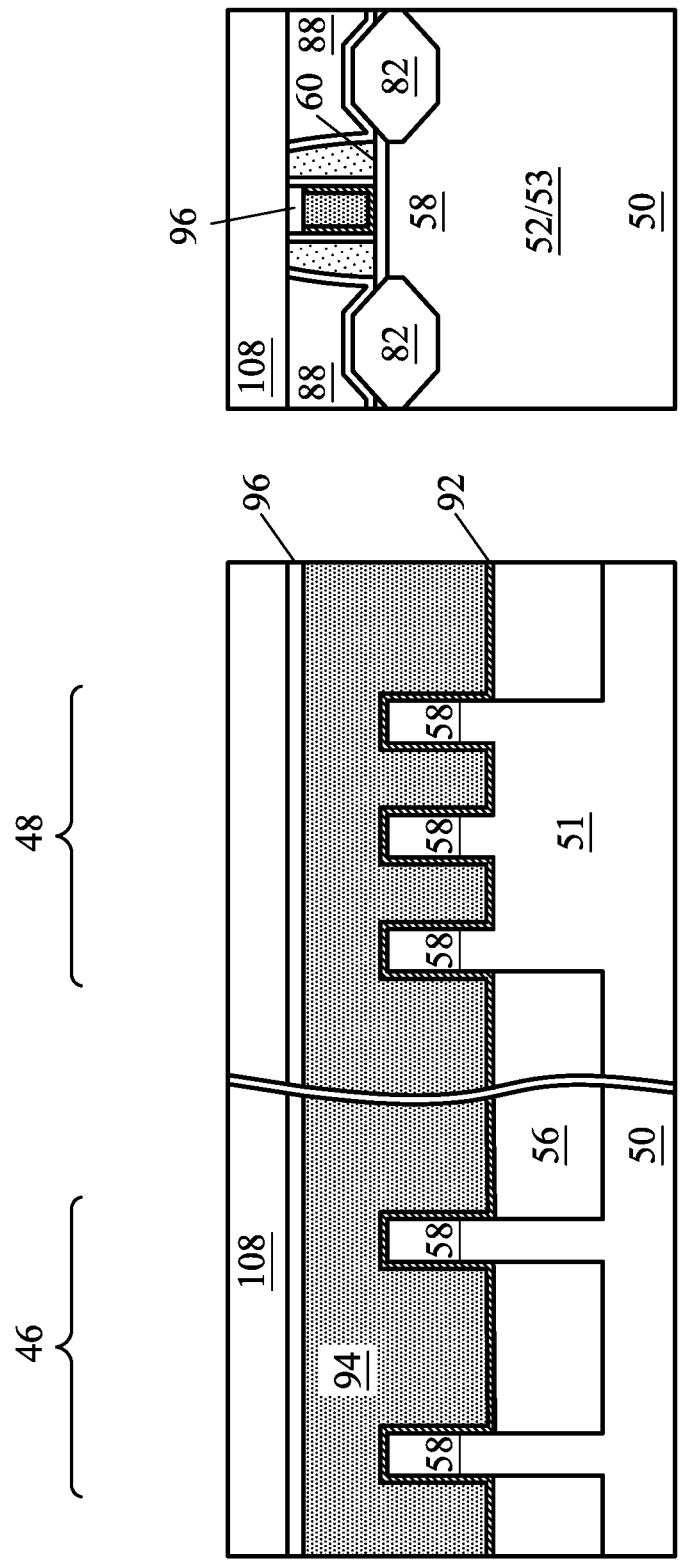

In FIGS. 21A and 21B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 21A and 21B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 22A and 22B) penetrate through the second ILD 108 and the gate mask 96 to contact the top surface of the recessed gate electrode 94.

Figures 22A, 22B:
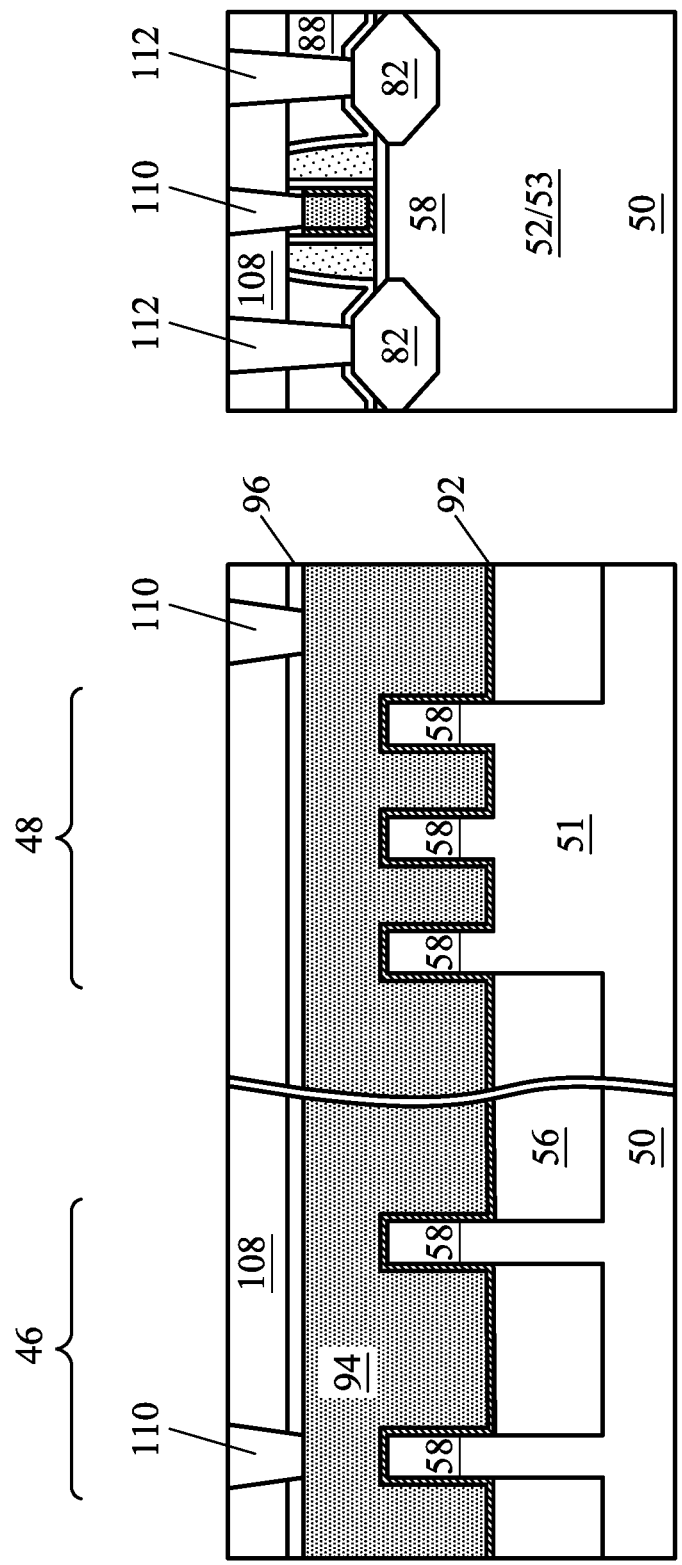

In FIGS. 22A and 22B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contacts 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The embodiments of the present disclosure have some advantageous features. The use of disclosed methods may result in the ability to convert a first dielectric layer between a first pair of adjacent fins having a first width between sidewalls of the first pair of adjacent fins and to convert a first dielectric layer between a second pair of adjacent fins having a second width different from the first width between sidewalls of the second pair of adjacent fins to a second dielectric layer of more uniform quality and composition. This allows for etch rate control as well as etch uniformity in the second dielectric layer between the first pair of adjacent fins and the second dielectric layer between the second pair of adjacent fins during a subsequent etching process. In addition, methods disclosed allow for the control of both the thickness and the depth uniformity of the converted second dielectric layer in between the first pair of adjacent fins and the converted second dielectric layer in between the second pair of adjacent fins.

In accordance with an embodiment, a method includes forming a first plurality of fins in a first region of a substrate, a first recess being interposed between adjacent fins in the first region of the substrate, the first recess having a first depth and a first width; forming a second plurality of fins in a second region of the substrate, a second recess being interposed between adjacent fins in the second region of the substrate, the second recess having a second depth and a second width, the second width of the second recess being less than the first width of the first recess, the second depth of the second recess being less than the first depth of the first recess; forming a first dielectric layer over the first plurality of fins and the second plurality of fins, where the first dielectric layer fills the first recess and the second recess; and converting an entire thickness of the first dielectric layer in the first recess and an entire thickness of the first dielectric layer in the second recess to a treated dielectric layer, where a first rate of conversion of the first dielectric layer in the first recess is higher than a second rate of conversion of the first dielectric layer in the second recess. In an embodiment, the method further includes recessing the treated dielectric, where after the recessing the first plurality of fins and the second plurality of fins protrude above an upper surface of the treated dielectric layer, where the upper surface of the treated dielectric layer is level with a bottom surface of the second recess. In an embodiment, the first depth is in a range from 100 nm to 180 nm and the second depth is in a range from 40 nm to 170 nm. In an embodiment, a difference between the first depth and the second depth is in a range from 10 nm to 60 nm. In an embodiment, after converting the entire thickness of the first dielectric layer in the first recess and the entire thickness of the first dielectric layer in the second recess the treated dielectric layer has a first concentration of nitrogen in the first recess and a second concentration of nitrogen in the second recess, the second concentration being within 10 percent of the first concentration. In an embodiment, during converting the entire thickness of the first dielectric layer in the first recess and the entire thickness of the first dielectric layer in the second recess the first rate of conversion of the first dielectric layer in the first recess is in a range from 7.75 to 700 nm/(min)$^{1/2}$. In an embodiment, during converting the entire thickness of the first dielectric layer in the first recess and the entire thickness of the first dielectric layer in the second recess the second rate of conversion of the first dielectric layer in the second recess is in a range from 6.2 to 600 nm/(min)$^{1/2}$. In an embodiment, converting the entire thickness of the first dielectric layer in the first recess and the entire thickness of the first dielectric layer in the second recess includes exposing the first dielectric layer to an oxygen-containing environment. In an embodiment, converting the entire thickness of the first dielectric layer in the first recess and the entire thickness of the first dielectric layer in the second recess includes performing a thermal anneal process in the oxygen-containing environment. In an embodiment, the treated dielectric layer includes an oxide.

In accordance with yet another embodiment, a method includes etching a semiconductor substrate to form a plurality of first fins in a first region of the semiconductor substrate, a first recess being interposed between adjacent first fins in the first region of the semiconductor substrate, the first recess having a first depth; and a plurality of second fins in a second region of the semiconductor substrate, a second recess being interposed between adjacent second fins in the second region of the semiconductor substrate, the second recess having a second depth, where the first depth is larger than the second depth, a sidewall of an outermost fin of the plurality of first fins and a sidewall of an outermost fin of the plurality of second fins having a same height; forming a first dielectric layer over the first plurality of fins and the second plurality of fins, where the first dielectric layer fills the first recess and the second recess, the first dielectric layer including a first dielectric material; and converting the first dielectric material to a second dielectric material to form a second dielectric layer, where at a first point of time during the conversion a first thickness of the first dielectric material in the first region of the semiconductor substrate is converted to the second dielectric material and a second thickness of the first dielectric material in the second region of the semiconductor substrate is converted to the second dielectric material, the first thickness being larger than the second thickness, where the first point of time is earlier than a second point of time at which the first dielectric material in the first region of the semiconductor substrate and the second region of the semiconductor substrate is fully converted to the second dielectric material. In an embodiment, converting the first dielectric material includes a thermal anneal process performed at a temperature in a range from 300° C. to 700° C. In an embodiment, converting the first dielectric material includes a wet anneal performed at a pressure in a range from 400 Torr to 760 Torr. In an embodiment, the first recess has a first width that is larger than a second width of the second recess. In an embodiment, after converting the first dielectric material to the second dielectric material, a concentration of nitrogen in the second dielectric material is in a range from $1\times10^{19}$ atoms/cm$^3$ to $1\times10^{21}$ atoms/cm$^3$.

In accordance with an embodiment, a semiconductor device includes a first plurality of fins extending from a substrate, the first plurality of fins having a first fin height that is in a range of 100 nm to 180 nm; a raised base portion extending from the substrate, the raised base portion having a first height that is in a range of 10 nm to 60 nm; a second plurality of fins on the raised base portion, the second plurality of fins having a second fin height, where a sum of the second fin height and the first height is in a range of 100 nm to 180 nm, a first width between a first sidewall of a fin of the first plurality of fins and nearest sidewall of an adjacent fin of the first plurality of fins being larger than a second width between a second sidewall of a fin of the second plurality of fins and nearest sidewall of an adjacent fin of the second plurality of fins; and an isolation layer between adjacent fins of the first plurality of fins. In an embodiment, the isolation layer has a thickness equal to the first height. In an embodiment, the isolation layer includes a dielectric material that includes an oxide. In an embodiment, the isolation layer has a nitrogen concentration in a range from $1\times10^{19}$ atoms/cm$^3$ to $1\times10^{21}$ atoms/cm$^3$. In an embodiment, the second fin height of the second plurality of fins is in a range from 40 nm to 170 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first plurality of fins protruding from a substrate;
    a base over and joined to a top surface of the substrate;
    a second plurality of fins overlapping and joined to the base, wherein a difference between a first height of the first plurality of fins and a second height of the second plurality of fins is in a range from 10 nm to 60 nm, the first plurality of fins having a first width between a first sidewall of a fin of the first plurality of fins and nearest sidewall of an adjacent fin of the first plurality of fins, and the second plurality of fins having a second width between a second sidewall of a fin of the second plurality of fins and nearest sidewall of an adjacent fin of the second plurality of fins, wherein a first ratio of the second height to the second width is smaller than a second ratio of the first height to the first width;

an isolation region disposed between adjacent fins of the first plurality of fins, wherein a top surface of the isolation region is substantially at a same level as a top surface of the base;

first source/drain regions disposed in the second plurality of fins, wherein each first source/drain region in a fin of the second plurality of fins is separate from an adjacent first source/drain region in an adjacent fin of the second plurality of fins; and second source/drain regions disposed in the first plurality of fins, wherein bottom surfaces of the second source/drain regions are below the top surface of the isolation region and below the top surface of the base.

2. The semiconductor device of claim 1, wherein the isolation region has a thickness equal to the difference between the first height of the first plurality of fins and the second height of the second plurality of fins.

3. The semiconductor device of claim 1, wherein the first height is in a range from 100 nm to 180 nm and the second height is in a range from 40 nm to 170 nm.

4. The semiconductor device of claim 1, wherein the first width is larger than the second width, and wherein the base has a third height that is smaller than the second height.

5. The semiconductor device of claim 4, further comprising a gate stack extending between adjacent fins of the second plurality of fins, wherein the gate stack is in physical contact with the top surface of the base, wherein the top surface of the base is interposed between the adjacent fins of the second plurality of fins.

6. The semiconductor device of claim 1, wherein the isolation region has a nitrogen concentration in a range from $1\times10^{19}$ atoms/cm$^3$ to $1\times10^{21}$ atoms/cm$^3$.

7. A semiconductor device comprising:
a plurality of first fins protruding from a first region of a substrate;
a semiconductor base over and joined to a top surface of a second region of the substrate;
a plurality of second fins protruding from the semiconductor base, wherein a first fin density of the plurality of first fins is less than a second fin density of the plurality of second fins, wherein a first height of the plurality of first fins is equal to a sum of a second height of the plurality of second fins and a third height of the semiconductor base;
an isolation layer disposed between adjacent fins of the plurality of first fins; and
a first gate stack extending over top surfaces and sidewalls of the plurality of first fins, wherein the first gate stack overlaps the isolation layer and extends from a first sidewall of a first fin of the adjacent fins of the plurality of first fins to a second sidewall of a second fin of the adjacent fins of the plurality of first fins; and
a second gate stack extending over top surfaces and sidewalls of the plurality of second fins, wherein the second gate stack extends from a third sidewall of a third fin of adjacent fins of the plurality of second fins to a fourth sidewall of a fourth fin of the adjacent fins of the plurality of second fins, wherein the second gate stack is in contact with a top surface of the semiconductor base, wherein the top surface of the semiconductor base is interposed between the third sidewall of the third fin and the fourth sidewall of the fourth fin, and wherein a thickness of the first gate stack at a midpoint between the first sidewall of the first fin and the second sidewall of the second fin is equal to a thickness of the second gate stack at a midpoint between the third sidewall of the third fin and the fourth sidewall of the fourth fin.

8. The semiconductor device of claim 7, wherein the isolation layer has a nitrogen concentration in a range from $1\times10^{19}$ atoms/cm$^3$ to $1\times10^{21}$ atoms/cm$^3$.

9. The semiconductor device of claim 7, wherein the isolation layer comprises a dielectric material that includes an oxide.

10. The semiconductor device of claim 7, wherein the first height of the plurality of first fins is in a range from 100 nm to 180 nm.

11. The semiconductor device of claim 10, wherein the second height of the plurality of second fins is in a range from 40 nm to 170 nm, and wherein the third height of the semiconductor base is in a range from 10 nm to 60 nm.

12. The semiconductor device of claim 7, wherein a difference in height between the first height and the second height is less than ten percent of the first height.

13. The semiconductor device of claim 7, wherein the plurality of first fins have a first width between a first sidewall of a fin of the plurality of first fins and nearest sidewall of an adjacent fin of the plurality of first fins, and the plurality of second fins have a second width between a second sidewall of a fin of the plurality of second fins and nearest sidewall of an adjacent fin of the plurality of second fins, wherein the first width is larger than the second width.

14. The semiconductor device of claim 13, wherein the first width is in a range from 40 nm to 200 nm.

15. The semiconductor device of claim 13, wherein the second width is in a range from 15 nm to 40 nm.

16. A semiconductor device comprising:
a first plurality of fins extending from a first region of a substrate, the first plurality of fins having a first height;
a raised base portion extending from a second region of the substrate, the raised base portion having a second height;
a second plurality of fins extending from a top surface of the raised base portion, the second plurality of fins having a third height, wherein a first fin density of the first plurality of fins is less than a second fin density of the second plurality of fins, a first width between a first sidewall of a fin of the first plurality of fins and nearest sidewall of an adjacent fin of the first plurality of fins being larger than a second width between a second sidewall of a fin of the second plurality of fins and nearest sidewall of an adjacent fin of the second plurality of fins, and wherein a first ratio of the third height to the second width is the same as a second ratio of the first height to the first width; and
an isolation layer between adjacent fins of the first plurality of fins, wherein the isolation layer has a thickness equal to the second height, wherein a top surface of the isolation layer is at a same level as the top surface of the raised base portion; and
first source/drain regions disposed in the first plurality of fins, wherein bottom surfaces of the first source/drain regions are below the top surface of the isolation layer and below the top surface of the raised base portion.

17. The semiconductor device of claim 16, wherein the isolation layer comprises an oxide.

18. The semiconductor device of claim 16, wherein each fin of the second plurality of fins has a width that is in a range from 2 nm to 20 nm.

19. The semiconductor device of claim 16, wherein a width between a sidewall of an outermost fin of the first plurality of fins and a sidewall of an outermost fin of the second plurality of fins is in a range from 40 nm to 140 nm.

20. The semiconductor device of claim 16, wherein the isolation layer has a nitrogen concentration in a range from $1\times10^{19}$ atoms/cm$^3$ to $1\times10^{21}$ atoms/cm$^3$.

* * * * *